(12) United States Patent
Nickel

(10) Patent No.: US 7,504,135 B2
(45) Date of Patent: *Mar. 17, 2009

(54) METHOD OF FABRICATING A MANGANESE DIFFUSION BARRIER

(75) Inventor: Janice H. Nickel, Sunnyvale, CA (US)

(73) Assignee: Samsung Electronics Co., Ltd (KR)

( * ) Notice: Subject to any disclaimer, the term of this patent is extended or adjusted under 35 U.S.C. 154(b) by 814 days.

This patent is subject to a terminal disclaimer.

(21) Appl. No.: 11/050,273

(22) Filed: Feb. 3, 2005

(65) Prior Publication Data

US 2006/0172086 A1     Aug. 3, 2006

(51) Int. Cl.
*C23C 14/18* (2006.01)
*C23C 14/12* (2006.01)
*C23C 14/48* (2006.01)

(52) U.S. Cl. .................. 427/525; 427/528; 427/531; 427/130; 427/131

(58) Field of Classification Search .................. None
See application file for complete search history.

(56) References Cited

U.S. PATENT DOCUMENTS

| | | | |
|---|---|---|---|
| 5,042,887 A | 8/1991 | Yamada | |
| 5,082,359 A | 1/1992 | Kirkpatrick | |
| 5,855,967 A | 1/1999 | Kirkpatrick | |
| 6,251,835 B1 | 6/2001 | Chu et al. | |
| 6,331,227 B1 | 12/2001 | Dykstra et al. | |
| 6,375,790 B1 | 4/2002 | Fenner | |
| 6,416,820 B1 | 7/2002 | Yamada | |
| 6,486,478 B1 | 11/2002 | Libby et al. | |
| 6,491,800 B2 | 12/2002 | Kirkpatrick et al. | |
| 6,498,107 B1 | 12/2002 | Fenner | |
| 6,537,606 B2 | 3/2003 | Allen et al. | |
| 6,595,506 B1 | 7/2003 | Zide et al. | |
| 6,613,240 B2 | 9/2003 | Skinner et al. | |
| 6,624,081 B2 | 9/2003 | Dykstra et al. | |
| 6,629,508 B2 | 10/2003 | Dykstra | |
| 6,635,883 B2 | 10/2003 | Torti et al. | |
| 6,646,277 B2 | 11/2003 | Mack et al. | |
| 6,660,340 B1 | 12/2003 | Kirkpatrick | |
| 6,676,989 B2 | 1/2004 | Kirkpatrick et al. | |

(Continued)

OTHER PUBLICATIONS htt;://www.epion.com/technology_body.html; Epion 15 Pages; Technology-GCIB Overview, no date, but printed from the Internet on Aug. 25, 2004.

(Continued)

*Primary Examiner*—Marianne L Padgett
(74) *Attorney, Agent, or Firm*—Myers Bigel Sibley & Sajovec

(57) ABSTRACT

A method of fabricating a diffusion barrier using a gas cluster ion beam apparatus is disclosed. The method includes generating a metal-organic gas that includes a metal-organic compound that includes an element of cobalt (Co) or cobalt and iron (CoFe). The metal-organic gas is combined with a carrier gas that is supplied to the gas cluster ion beam apparatus (GCIB). The GCIB processes the carrier gas to form a beam of gas cluster ions that include the metal-organic compound. The beam irradiates an interface surface of a target material (e.g. an IrMn, PtMn, or MnFe antiferromagnetic layer) and at least a portion of the Co or CoFe remains in contact with the interface surface to form a barrier that prevents a diffusion of manganese (Mn).

19 Claims, 12 Drawing Sheets

U.S. PATENT DOCUMENTS

| | | |
|---|---|---|
| 6,737,643 B2 | 5/2004 | Torti et al. |
| 6,750,460 B2 | 6/2004 | Greer |
| 6,770,874 B2 | 8/2004 | Dykstra |
| 6,797,334 B2 * | 9/2004 | Akizuki et al. ............. 427/523 |
| 6,797,339 B2 * | 9/2004 | Akizuki et al. ............. 427/562 |
| 7,071,122 B2 * | 7/2006 | Saenger et al. ............. 438/778 |
| 7,186,992 B2 * | 3/2007 | Nickel ................... 250/492.21 |
| 2002/0068132 A1 * | 6/2002 | Skinner et al. ............. 427/524 |
| 2003/0021908 A1 * | 1/2003 | Nickel et al. ................ 427/551 |
| 2005/0127417 A1 * | 6/2005 | Saenger et al. ............. 257/295 |
| 2006/0105570 A1 * | 5/2006 | Hautala et al. ............. 438/687 |
| 2008/0230714 A1 * | 9/2008 | Lane .......................... 250/427 |

OTHER PUBLICATIONS

Electronic Engineering Time; Jun. 14, 2004; Infusion Doping Gets the Call in Battle to Stop Leakage; by Mark Lapedus.
http://solidstate.articles.printthis.clickability.com/pt/cpt?action=cpt&title=usj+and+strain..; SolidState Technoogy; USJ and Strained-Si Formation Using Infusion Doping and, no date, but printed from Internet on Aug. 25, 2004.
Slides From Epion ; 64 Pages; Re: GCIB Application, no date.
Pending U.S. Appl. No. 10/977,382, filed Oct. 29, 2004, inventor: Janice H Nickel.

* cited by examiner t >> d  FIG. 8a t >> d  FIG. 8b $r_1 \ll r_0$     FIG. 9b

METHOD OF FABRICATING A MANGANESE DIFFUSION BARRIER

FIELD OF THE INVENTION

The present invention relates generally to a method of fabricating a manganese diffusion barrier. More specifically, the present invention relates to a method of fabricating a manganese diffusion barrier at an interface surface in a magnetoresistance device using a gas cluster ion beam apparatus and a metal-organic gas generator.

BACKGROUND ART

A magnetoresistance device is a type of memory device in which data can be stored as an alterable orientation of magnetization. As one example, in FIGS. 1a and 1b, a prior tunneling magnetoresistance (TMR) device 200 includes a reference layer 212 (also referred to as a pinning film or pinned layer) that includes a pinned orientation of magnetization M1 that is fixed in a predetermined orientation, a data layer 210 that includes an alterable orientation of magnetization M2 that can be altered by an external magnetic field, and a thin tunnel barrier layer 211 that separates the data layer 210 from the reference layer 212.

A state of the data stored in the data layer 210 is determined by an orientation of the alterable orientation of magnetization M2 relative to the pinned orientation of magnetization M1. For example, if the alterable orientation of magnetization M2 is oriented in the same direction as the pinned orientation of magnetization M1 (e.g. parallel as in FIG. 1a), then a logic "1" is stored in the data layer 210. On the other hand, if the alterable orientation of magnetization M2 is oriented in a direction opposite that of the pinned orientation of magnetization M1 (e.g. anti-parallel as in FIG. 1b), then a logic "0" is stored in the data layer 210.

For the TMR device 200, the state of the data stored in the data layer 210 is determined by measuring or sensing a tunneling resistance across the data and reference layers (210, 212). One value of resistance is indicative of the logic "1" and a different value of resistance is indicative of the logic "0". It is desirable to have the value of resistance for the logic "1" be as far apart as possible from the value of resistance for the logic "0". The further apart those two values are, the higher a signal-to-noise ratio ΔR/R of the TMR device 200. The ΔR is a change in resistance from a logic "1" to a logic "0" or vice-versa and R is a lower of the two resistance values for a logic "1" and a logic "0". A high signal-to-noise ratio allows for accurate sensing of the data in the data layer 210 during a read operation to the TMR device 200. Accurate sensing is a necessity if the TMR device 200 is to be used for data storage (e.g. as a MRAM device). A low signal-to-noise ratio is undesirable because the value of resistance for the logic "0" is not different enough from the value of resistance for the logic "1"; therefore, the state of the data cannot be accurately determined and the TMR device will not be suitable as a memory device for data storage.

In FIGS. 2a and 2b, a plurality of thin film layers of material are required to form the prior TMR device 200. The layers used will depend on a selected topology for the TMR device 200. Typically, the layers are only a few nanometers thick. For example, the tunnel barrier layer 211 can be 1.0 nm thick or less. The data and reference layers (210, 212) can be 10 nm thick or less. The tunnel barrier layer 211 can be made from a dielectric material, such as aluminum oxide ($Al_2O_3$), for example. The data and reference layers (210, 212) can be made from one or more layers of a ferromagnetic material. Examples of materials for the data layer 210 include nickel-iron (NiFe) or a sandwich of nickel-iron:colbalt-iron (NiFe:CoFe). Examples of materials for the reference layer 212 include a sandwich of cobalt-iron:ruthenium:cobalt-iron (CoFe:Ru:CoFe) or nickel-iron (NiFe).

One disadvantage of prior the TMR device 200 is that a topology of the TMR device 200 can include a pinning film 214 that is adjacent to the reference layer 212 and is operative to prevent rotation of the pinned orientation of magnetization M1 in response to an external magnetic field (e.g. write currents). The pinning film 214 can be made from a material that includes manganese (Mn), such as IrMn, PtMn, and MnFe, for example. The manganese (Mn) in the pinning film 214 can diffuse (see dashed arrows D) across an interface I between the pinning film 214 and the reference layer 212, particularly at high processing temperatures (e.g. ≧400° C.) that are required to integrate magnetoresistance devices with CMOS circuitry to form a data storage device (e.g. MRAM). The diffusion D of the Mn into the reference layer 212 at those high processing temperatures results in a low signal-to-noise ratio ΔR/R and the low signal-to-noise ratio ΔR/R renders the device useless for data storage purposes. Solutions to the diffusion problem include not using a high temperature CMOS process or providing a diffusion barrier between the pinning film 214 and the reference layer 212 to prevent the diffusion D of the Mn across the interface I. At present, it is not possible to eliminate CMOS circuitry and the high temperatures incumbent to the CMOS fabrication process.

Cobalt (Co) has been found to be an effective Mn diffusion barrier. Prior methods for depositing the Co include sputtering deposition processes that are well understood in the microelectronics art. Unfortunately, in standard sputtering deposition systems the coverage of the Co material is not uniform across the layer the Co is deposited on. Metals (e.g. Co) tend to form island growth, and then coalesce into a continuous film. However, Co has a high saturation magnetization and can therefore impart a large antiferromagnetic coupling to magnetic memory element.

Another solution is to use an artificial antiferromagnet which does not contain Mn; however, artificial antiferromagnet structures require huge magnetic field anneals to set their magnetic state. Obtaining such a large magnetic field across a semiconductor wafer of 8.0 inches or more in diameter is prohibitively expensive. Another solution is to leave a bottom conductor of the magnetic memory element unpatterned; however, an unpatterned conductor increases a probability of reduced device yields due to shorting.

Accordingly, a method for depositing a very thin layer of material for a Mn diffusion barriers is desired. Atomic layer deposition (ALD), used primarily in the semiconductor industry, is one prior method for depositing thin layers of material. ALD is a reactive deposition method as opposed to a direct deposition method. For some materials ALD requires a water precursor, which can be destructive to device materials and/or properties, especially in materials that are susceptible to corrosion, such as the ferromagnetic materials in a TMR junction. ALD creates uniform thin film layers with very controllable thickness; however, the deposited layer is conformal to the underlying topography. If the topography is non-uniform, defects such as asperities and pinholes can result in breaches in the diffusion barrier through which the Mn can diffuse into the reference layer 212.

Consequently, there exists a need for a method of fabricating a manganese diffusion barrier at an interface in a magnetoresistance device. There is also a need for a method of fabricating a manganese diffusion barrier at an interface in a magnetoresistance device that can create a uniform interface surface upon which to deposit the manganese diffusion barrier. Finally, there is a need for a method of fabricating a manganese diffusion barrier that produces a very thin and uniform diffusion barrier on an interface surface.

SUMMARY OF THE INVENTION

The present invention solves the aforementioned problems by combining a gas cluster ion beam apparatus (GCIB) with a source that generates a metal-organic gas that includes at least one metal-organic compounds that includes the elements cobalt or cobalt and iron. The metal-organic gas is combined with a carrier gas to form a composite gas that includes the metal-organic compounds. The composite gas is processed by the GCIB (e.g. is clustered, ionized, and accelerated) and is targeted at an interface surface of a target material so that at least a portion of the cobalt or cobalt and iron in the metal-organic compounds remain in contact with the interface surface. The cobalt or cobalt and iron form a thin and uniform manganese diffusion barrier on the interface surface. The manganese diffusion barrier prevents manganese (Mn) in an antiferromagnetic layer from diffusing into a ferromagnetic reference layer so that a high signal-to-noise ratio is maintained. The manganese diffusion barrier also allows for high processing temperatures that are customary in CMOS fabrication.

A method of fabricating a diffusion barrier using a gas cluster ion beam apparatus includes generating a metal-organic gas that includes a metal-organic compound. The metal-organic compound includes cobalt (Co) or cobalt and iron (CoFe). A composite gas is formed by combining the metal-organic gas with a carrier gas. The carrier gas is supplied to the gas cluster ion beam apparatus. A beam including a plurality of gas clusters is formed from the composite gas and the gas clusters are then ionized to form gas cluster ions. The gas cluster ions are then accelerated and the beam of gas cluster ions irradiate an interface surface so that the gas cluster ions impact on the interface surface and at least a portion of the cobalt (Co) or the cobalt and iron (CoFe) remains in contact with the interface surface and form a manganese diffusion barrier on the interface surface.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 8a is a cross-sectional view depicting a manganese diffusion barrier formed on an interface surface.

FIG. 8b is an enlarged cross-sectional view of a section I-I of FIG. 8a.

FIG. 9b is a cross-sectional view depicting a reduced surface roughness in the interface surface of FIG. 8d after a smoothing process.

DETAILED DESCRIPTION

Figure 1A:
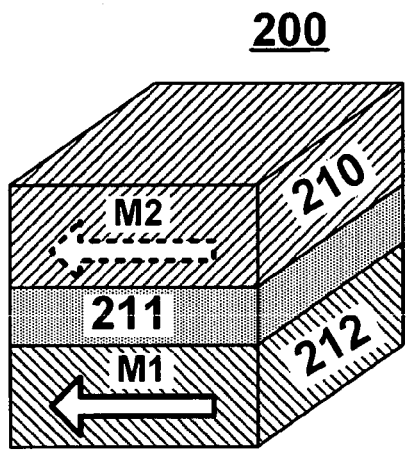
FIGS. 1a and 1b depicts data storage in a prior magnetoresistance memory device.

In the following detailed description and in the several figures of the drawings, like elements are identified with like reference numerals.

As shown in the drawings for purpose of illustration, the present invention is embodied in a method of fabricating a diffusion barrier using a gas cluster ion beam apparatus (GCIB). The method includes generating a metal-organic gas including a metal-organic compound with the metal-organic compound including an element of cobalt (Co) or an element cobalt and iron (CoFe). A composite gas is formed by combining the metal-organic gas with a carrier gas. The GCIB processes the composite gas to form a beam of gas cluster ions. An interface surface is irradiated with the beam of gas cluster ions. Upon impact with the interface surface, a portion of the cobalt or cobalt and iron remain in contact with the interface surface and form a manganese diffusion barrier.

Figure 3:
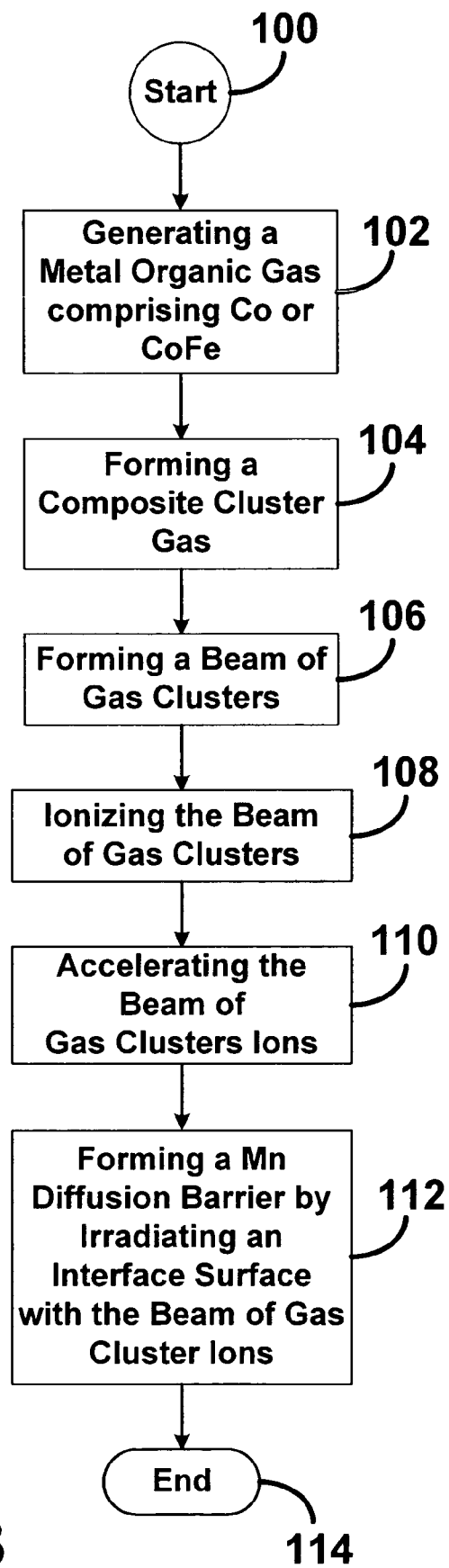
FIG. 3 is a flow diagram depicting a method of fabricating a manganese diffusion barrier using a gas cluster ion beam apparatus.

In FIG. 3, a method 100 of fabricating a diffusion barrier using a gas cluster ion beam apparatus includes at a stage 102, generating a metal-organic gas that includes at least one metal-organic compound. Processes for generating the metal-organic gas are well understood in the microelectronics art and include but are not limited to using a metal-organic chemical vapor deposition (MOCVD) process to generate the metal-organic gas.

Figure 5:
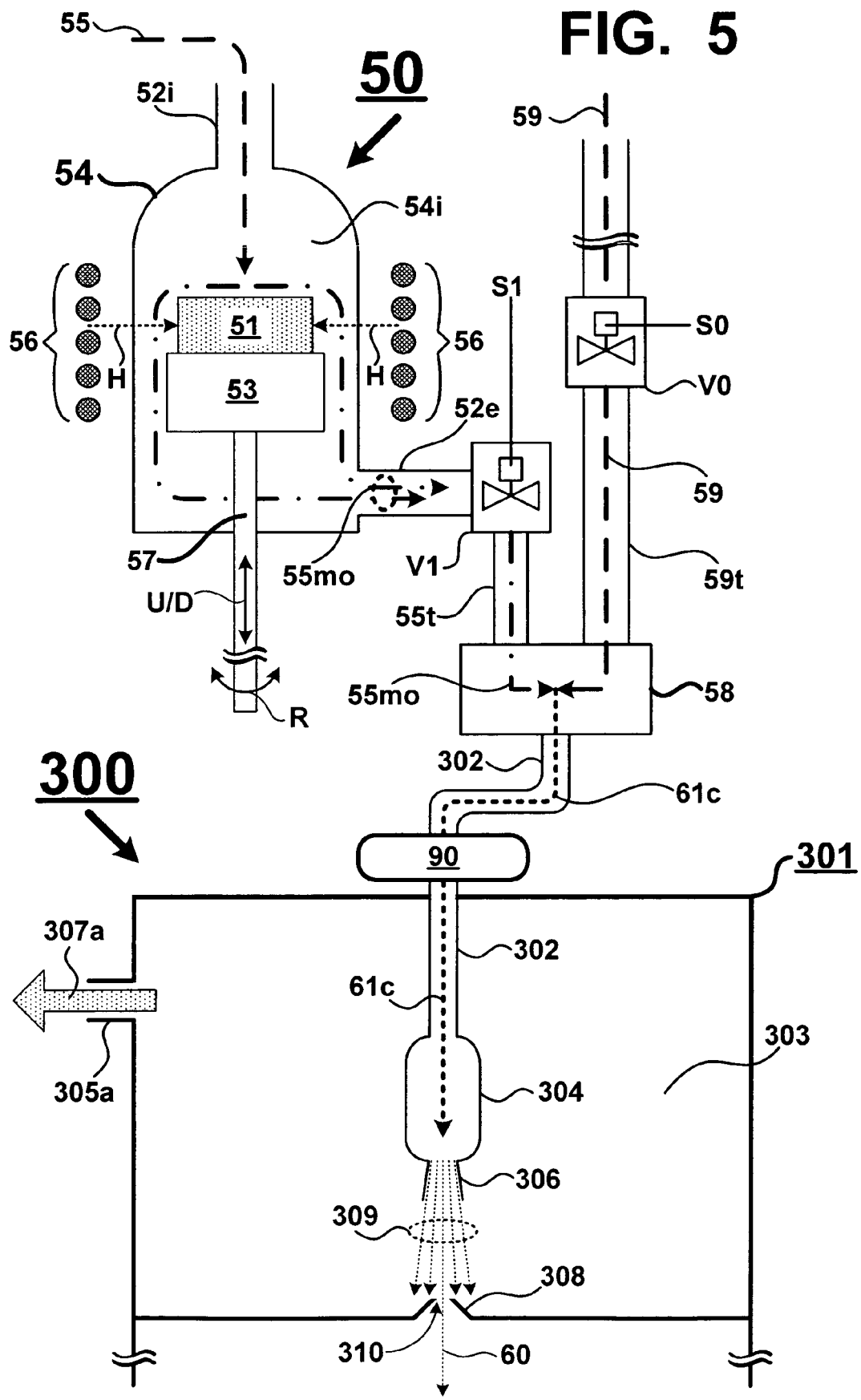
FIG. 5 is a cross-sectional view depicting an example of a generator for generating a metal-organic gas that includes metal-organic compounds.

Referring to FIG. 5, as one example of how the metal-organic gas can be generated at the stage 102, a metal-organic generator 50 includes a reactor vessel 54 that includes a metal-organic source material 51 connected with a substrate 53 and positioned in an interior 54i of the reactor vessel 54. For example, the substrate 53 can be a platen upon which the metal-organic source material 51 is mounted. The metal-organic source material 51 includes at least one metal-organic compound that includes the elements cobalt (Co) or cobalt and iron (CoFe). Those skilled in the microelectronics art will appreciate that the metal-organic source material 51 may include other elements and trace elements in addition to the cobalt (Co) or cobalt and iron (CoFe). The cobalt (Co) or the cobalt and iron (CoFe) are selected because they are effective as a manganese diffusion barrier in a magnetoresistance device. A gas inlet 52i is connected to a gas source (not shown) so that a gas 55 is communicated into the interior 54i. A heat source 56 is positioned in thermal communication with the reactor vessel 54 so that heat H generated by the heat source 56 heats up the metal-organic source material 51 as the gas 55 flows over the metal-organic source material 51. The heating H results in a dissociating of the metal-organic compounds carried by the metal-organic source material 51 into the gas 55. The dissociated metal-organic compounds are carried away by the gas 55 to form a metal-organic gas 55mo. Consequently, the cobalt (Co) or the cobalt and iron (CoFe) will be incorporated into the metal-organic gas 55mo.

Those skilled in the microelectronics art will appreciate the heating H of the metal-organic source material 51 can be accomplished using a variety of methods including but not limited to the use of radio frequency coils (RF coils) as the heat source 56. The RF coils can be electrically connected with a RF power supply (not shown). During the heating H, a shaft 57 connected with the substrate 53 may optionally be used to rotate R and/or translate U/D the substrate 53 to effectuate the dissociation of the metal-organic compound into the gas 55 and to properly position the metal-organic source material 51 in a heat zone generated by the heat source 56. The metal-organic gas 55mo can exit the reactor vessel 54 through an exhaust port 52e. The metal-organic generator 50 can be like those used in a MOCVD apparatus, for example. However, other means can be used to generate the metal-organic gas 55mo and the present invention is not be construed as being limited to the examples set forth herein.

Returning to FIG. 3, at a stage 104, a composite gas 61c is formed by combining the metal-organic gas 55mo with a carrier gas 59. Typically, the carrier gas 59 is a condensible gas used by a gas cluster ion beam apparatus 300 (GCIB 300 hereinafter) to form a plurality of gas clusters. The gas clusters formed in the GCIB 300 will include atoms and/or molecules of the cobalt (Co) or the cobalt and iron (CoFe). The carrier gas 59 is combined (e.g. mixed) with the metal-organic gas 55mo to form the composite gas 61c so that the metal-organic compounds carried by the metal-organic gas 55mo are included the gas clusters generated by the GCIB 300. The carrier gas 59 and the gas 55 may be identical gasses or they can be different gasses. Moreover, the carrier gas 59 and the gas 55 may be supplied from the same gas source or they may be supplied from different gas sources. The carrier gas 59 can be a gas including but not limited to an inert gas, nitrogen (N), oxides of nitrogen, oxygen ($O_2$), carbon dioxide ($CO_2$), carbon monoxide (CO), xenon (Xe), hydrogen (H), fluorine (F), methane ($CH_4$), silane ($SiH_4$), sulfur hexafluoride ($SF_6$), and a fluorocarbon.

As one example of how the metal-organic gas 55mo can be combined with the carrier gas 59, in FIG. 5, the metal-organic gas 55mo and the carrier gas 59 are combined in a manifold 58 via tubes (55t, 59t) where the gasses mix together to form the composite gas 61c. Optionally, a series of valves V0 and V1 can be used to control the flow of the gasses (55mo, 59). The valves (V0, V1) can be manually actuated by a user, mechanically actuated, or electrically actuated by a computer or a dedicated process controller, for example. For instances, the valves (V0, V1) can be electrically actuated via electrical signals (S0, S1) in electrical communication with a computer running a software program that controls the metal-organic generator 50 and/or the GCIB 300.

As will be described below, the GCIB 300 can also be used for surface smoothing by bombarding a surface with gas cluster ions. To that end, the valve V1 can be closed and the valve V0 can remain open so that gas cluster ions formed by the carrier gas can be used for a surface smoothing process. On the other hand, if the composite gas is suitable for surface smoothing, then both valves (V0, V1) can remain open for the surface smoothing process.

In FIG. 3, at a stage 106, a beam 60 comprising a plurality of gas cluster is formed from the composite gas 61c. The beam 60 includes the metal-organic compounds carried by the composite gas 61c (e.g. Co or CoFe). Turning to FIG. 5, as is well understood in the GCIB art, the GCIB 300 includes a gas source chamber 301 that includes a gas feed tube 302 connected with a stagnation chamber 304. The composite gas 61c enters the stagnation chamber 304 at a high pressure where it condenses and then adiabatically expands through an expansion nozzle 306 to form a plurality of gas clusters 309. The gas clusters 309 can include several to several thousand (e.g. >5000) weakly bound atoms and/or molecules. Some of those atoms and/or molecules will comprise the cobalt (Co) or the cobalt and iron (CoFe). A majority of the gas clusters 309 are skimmed away by a skimmer 308 that includes a very small aperture 310. However, a core of the gas clusters 309 pass through the aperture 310 to form the beam 60 comprising the gas clusters 309. An interior 303 of the gas source chamber 301 should be maintained at level of vacuum (e.g. $<10^{-3}$ torr) necessary for the generation of the beam 60. Accordingly, the gas source chamber 301 typically includes a fitting 305a connected with a vacuum source 307a (not shown) that maintains a precise vacuum in the interior 303.

The configuration depicted in FIG. 5 is only one example of how the metal-organic gas 55mo can be generated. Those skilled in the microelectronics art will appreciate that if the gas 55 and the carrier gas 59 are identical, then the manifold 58, the valve V0, and the tube 59t may be eliminated and the tube 55t can be connected with the gas feed tube 302. Consequently, the gas 55 serves as the carrier gas for the GCIB 300 and the composite gas 61c comprises the metal-organic compounds that are dissociated from the metal-organic source material 51 into the gas 55 to form the metal-organic gas 55mo. Therefore, if the gas 55 is used as the carrier gas, then the gas 55 should be a compressible gas suitable for forming the gas clusters 309.

For some applications, it may be necessary to purify the metal-organic gas 55mo to remove one or more elements from the gas so that they are reduced in concentration or are not included in the composite gas 61c. To that end, a filter 90 can be used to remove or reduce the number of undesirable elements contained in the metal-organic gas 55mo. For example, the filter 90 can be a mass analyzer (e.g. such as the type used in mass spectrometry) that sorts species of elements based on a mass-to-charge ratio. Although depicted with a position that is in line with the gas feed tube 302, the filter 90 may also be placed in line with the exhaust port 52e or the tube 55t.

Figure 6:
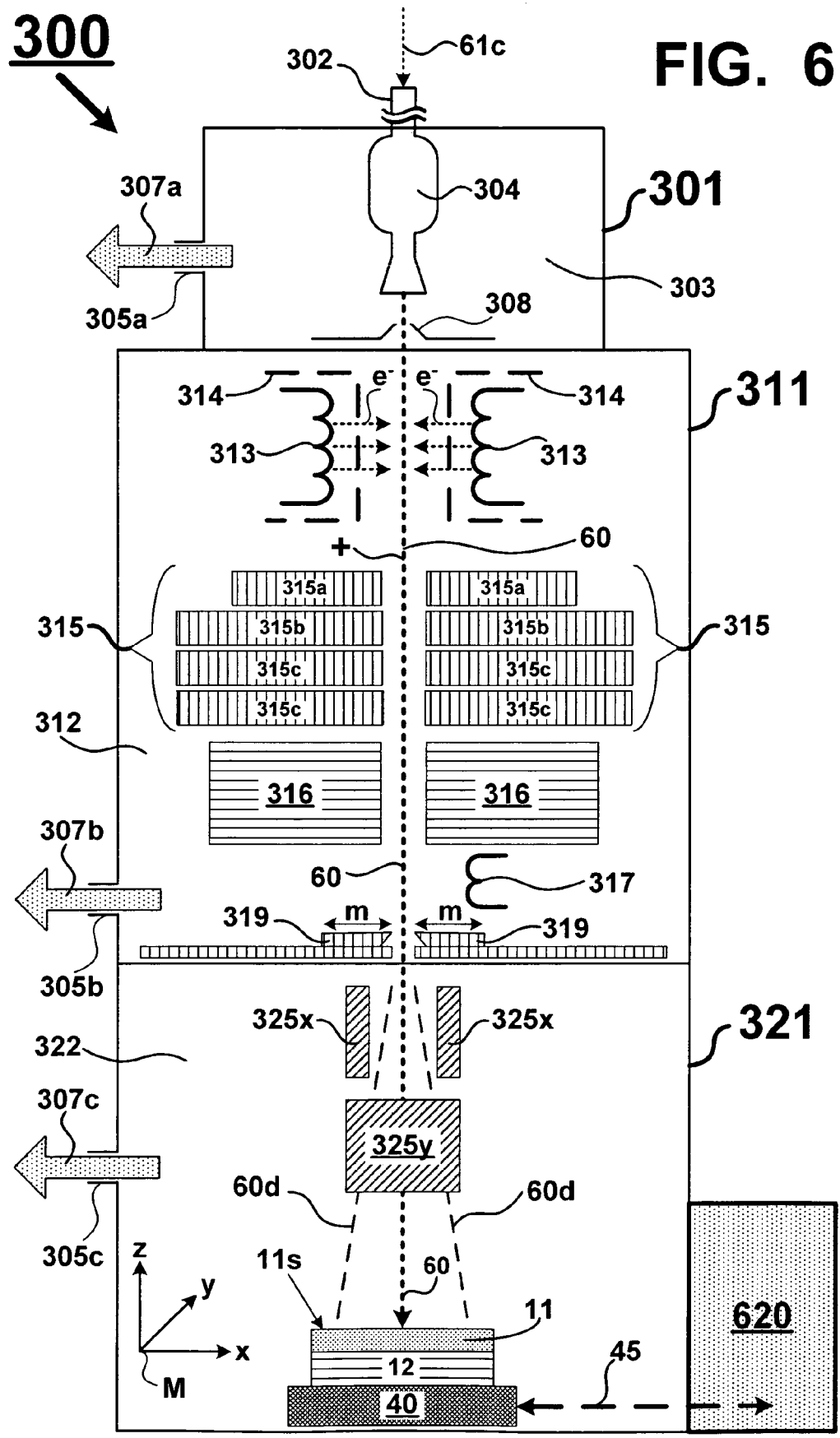
FIG. 6 is cross-sectional view depicting a gas cluster ion beam apparatus irradiating an interface surface with a beam of gas cluster ions.

Turning to FIG. 6 and referring to a stage 108 in FIG. 3, the beam 60 is ionized to impart a net charge (i.e. a positive "+" or a negative "−" charge) on each gas cluster 309 in the beam 60. As an example, the GCIB 300 can include an ionization chamber 311 that includes an ionization filament 313 for generating a stream of thermoelectrons e− that bombard the beam 60 resulting in electrons being ejected from the gas clusters 309 so that a net positive charge "+" is imparted to the gas clusters 309. An anode 314 is positioned adjacent to the filaments 313 and extracts the thermoelectrons e− from the filaments 313. The ionization filaments 313 and the anodes 314 can be connected with appropriate power supplies (not shown) to heat the ionization filaments 313 and to bias the anodes 314. A fitting 305b can be connected to a vacuum source 307b (not shown) that maintains a precise vacuum in an interior 312 of the ionization chamber 311.

At a stage 110, the beam 60 is accelerated to increase a momentum of the gas clusters 309. The GCIB 300 can include an acceleration section 315 that includes a plurality of high voltage electrodes that are connected with appropriate high voltage power supplies (not shown) and operative to accelerate and focus the beam 60. For example, the acceleration section 315 can include an extraction electrode 315a for extracting ions from the ionization region of the ionization filaments 313, an accelerator electrode 315b for accelerating the beam 60 to an energy level in the keV range, and one or more lens electrodes 315c for electrostatically focusing the beam 60 so the beam 60 is collimated and follows a predictable trajectory through the GCIB 300 towards an interface surface of a target material as will be described below.

Optionally, the GCIB 300 may also include: a magnetic filter 316 for deflecting light monomer ions and dimers out of the beam 60 while not deflecting the heavier gas cluster ions 309 that include the metal-organic compounds; a neutralizing filament 317 to inject low energy electrons into the beam 60 to prevent an excess positive charge build up on the target material/substrate during processing of the interface surface; and a shutter 319 that can be moved m to a blocking position to block the beam 60 during processing of the interface surface.

During the aforementioned stages 104, 106, 108, and 110, the GCIB 300 processes the composite gas 61c so that the beam 60 includes accelerated gas cluster ions 309 that include the elements Co or CoFe. As will be described below, the beam 60 will be used to irradiate an interface surface to form a Mn diffusion barrier.

Accordingly, in FIG. 6, at a stage 112, the beam 60 passes into a processing section 321 of the GCIB 300 and irradiates an interface surface 11s of a target material 11 so that the gas cluster ions 309 impact on the interface surface 11s and disintegrate upon impact with the interface surface 11s. Upon impact, at least a portion the cobalt (Co) or the cobalt and iron (CoFe) in the gas cluster ions 309 remain in contact with the interface surface 11s and form a manganese diffusion barrier 20. The target material 11 can be connected with a substrate 40 that supports and securely holds the target material 11 during processing of the interface surface 11s or the target material 11 can be connected with one or more layers of material denoted as a layer 12.

Figure 4A:
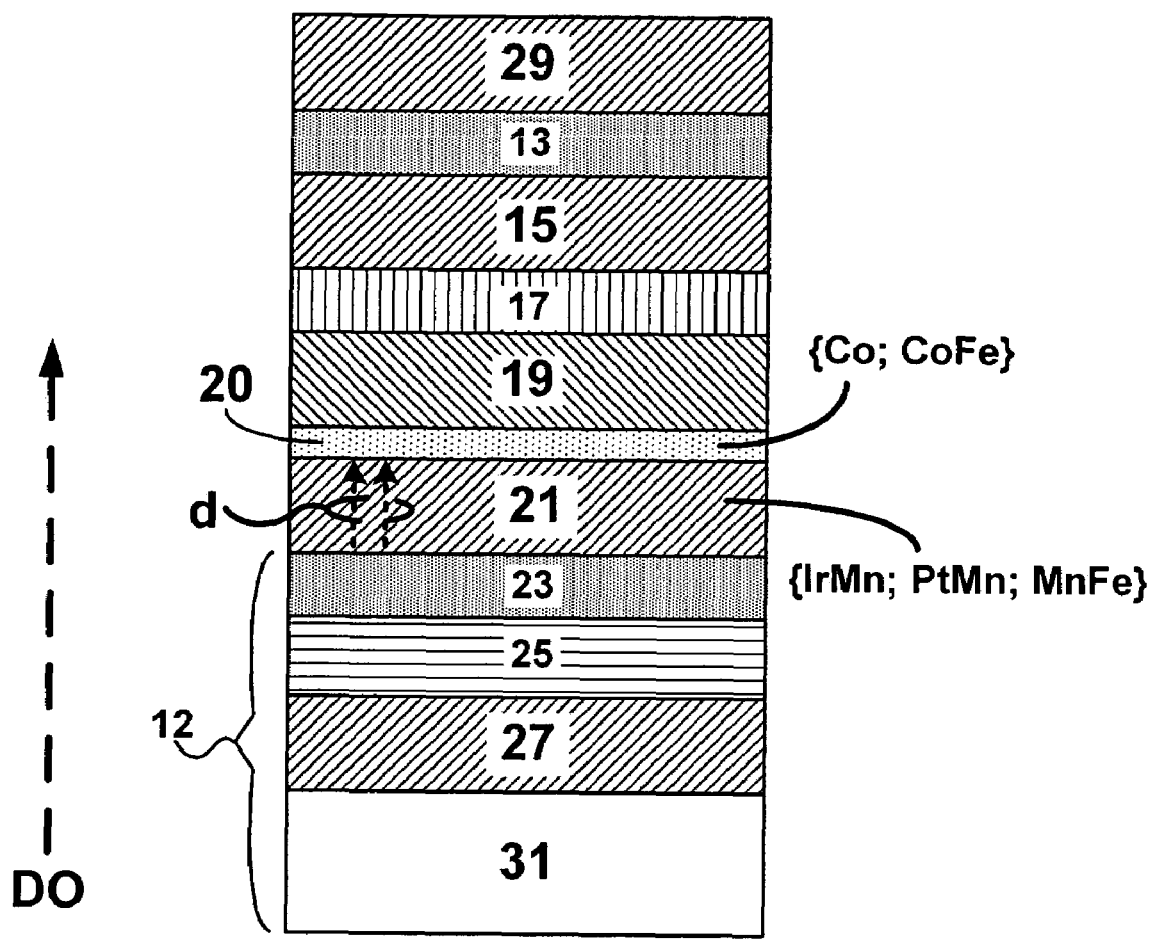
FIGS. 4a and 4b are cross-sectional views depicting a magnetoresistance memory device including a manganese diffusion barrier.

For example, in FIG. 4a, the layer 12 can comprise a plurality of thin film layers of material that were formed in a deposition order DO and those layers are a subset of the many thin film layers that comprise a magnetoresistance device 10. The layer 12 can include a substrate layer (e.g. a Si substrate), a first electrode 27, and a seed layer (25, 23) of tantalum (Ta) and nickel-iron (NiFe). The next layer in the deposition order DO can be an antiferromagnetic layer 21 that includes the element manganese (e.g. IrMn; PtMn; MnFe) and that layer (i.e. 21) can be the target material 11 whose interface surface 11s is irradiated at the stage 112 to form the manganese diffusion barrier 20. The Co or the CoFe in the manganese diffusion barrier 20 prevent a diffusion d of the manganese (Mn) from the antiferromagnetic layer 21 to a ferromagnetic layer 19 that is subsequently deposited on the manganese diffusion barrier 20 in the deposition order DO. By preventing the diffusion d of the Mn, a signal-to-noise ratio ΔR/R of a tunneling resistance of the magnetoresistance device 10 will be sufficient to allow for an error free sensing of a state of a bit of data stored in a data layer (see layer 15 in FIG. 4a) of the magnetoresistance device 10.

Figure 4B:
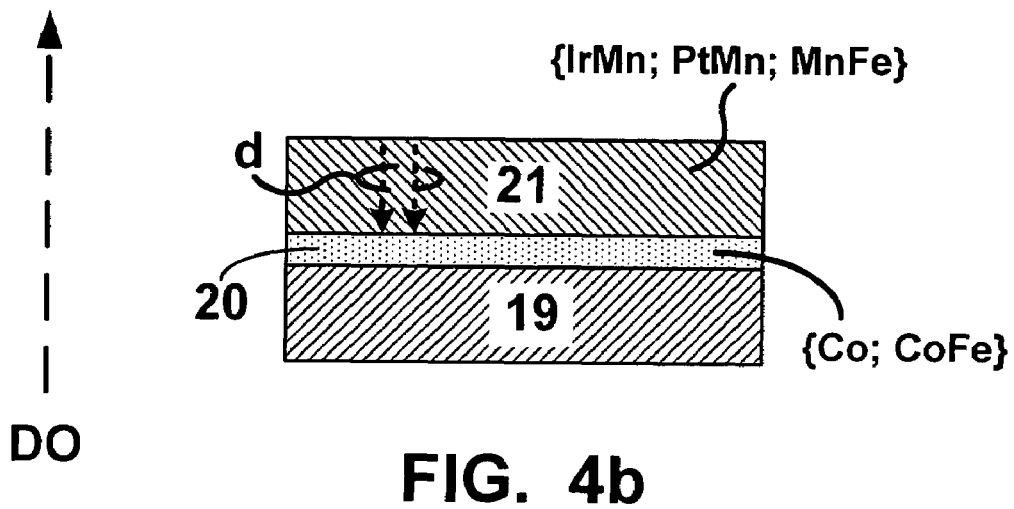

In contrast, in FIG. 4b, the ferromagnetic layer 19 may be formed prior to the antiferromagnetic layer 21 in the deposition order DO. Therefore, the ferromagnetic layer 19 can be the target material 11 whose interface surface 11s is irradiated at the stage 112 to form the manganese diffusion barrier 20. Consequently, the manganese diffusion barrier 20 prevents the diffusion of the manganese (Mn) from the antiferromagnetic layer 21 to the ferromagnetic layer 19. In FIG. 4b, other layers of material that may be positioned below the ferromagnetic layer 19 are not shown.

The antiferromagnetic layer 21 can be a pinning film (also called a pinning layer) and a composition of the antiferromagnetic layer 21 can include but is not limited to a layer comprising iridium-manganese (IrMn), platinum-manganese (PtMn), and manganese-iron (MnFe). The ferromagnetic layer 19 can be a reference layer (also called a pinned layer) and can have a composition including but not limited to cobalt-iron:ruthenium:colbalt-iron (CoFe:Ru:CoFe) and nickel-iron (NiFe).

The substrate 40 can be a vacuum chuck, a platen, a motion controlled x-y-z stage, or the like. The processing section 321 may include a pair of electrostatic deflection electrodes (325x, 325y) for deflecting 60d the beam 60 along a plane (e.g. a x-y plane) during processing of the interface surface 11s and to scan the beam 60 over the interface surface 11s. As was mentioned above, the processing section 321 can include a fitting 305c that is connected to a vacuum source 307c (not shown). As will be described below in greater detail, a motion M of the substrate 40 can be used to move the substrate 40 relative to the beam 60 during the irradiating at the stage 112 as depicted by a x-y-z axis. The motion M can include rotational, translational, and angular movements of the substrate 40.

Figure 7A:
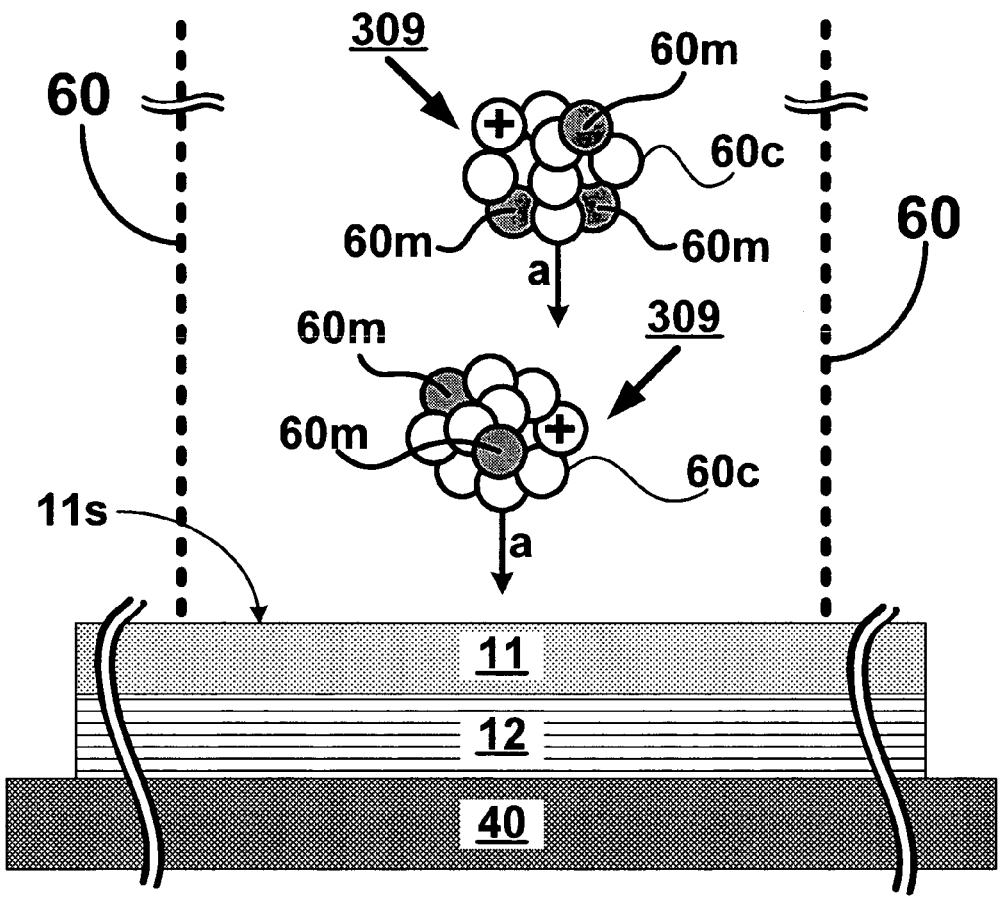
FIGS. 7a and 7b are cross-sectional views depicting an irradiating of an interface surface by a beam of gas cluster ions.

Referring to FIG. 7a, the beam 60 (denoted by heavy dashed lines) comprises a plurality of gas clusters ons 309 that have a net positive + charge. Although not shown, the net charge can also be negative −. The gas clusters ions 309 are moving in a direction a and are depicted just prior to their impact on the interface surface 11s. Each gas clusters ion 309 includes atoms and/or molecules 60c that are determined by a composition of the carrier gas 59 and atoms and/or molecules of the metal-organic compound 60m that are determined by a composition of the metal-organic gas 55mo. As described above, the metal-organic compound 60m includes the elements cobalt (Co) or cobalt-iron (CoFe). The processing section 321 can include a fitting 305c that is connected with a vacuum source 307c (not shown) for maintaining a precise vacuum in an interior 322 of the processing section 321.

Figure 7B:
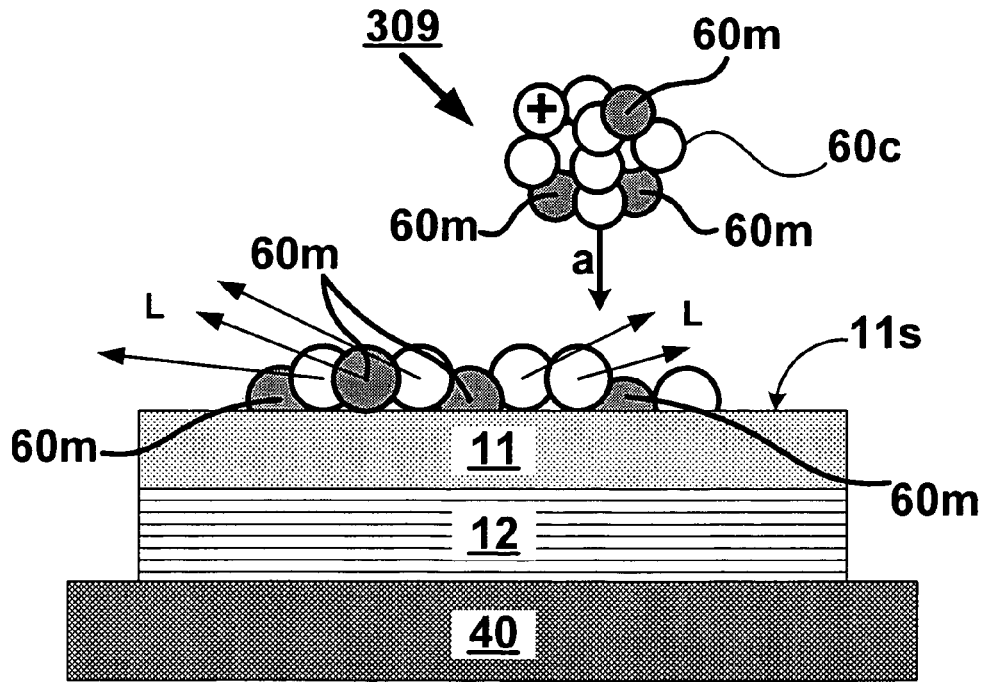

In FIG. 7b, upon impact with the interface surface 11s, the gas clusters ions 309 disintegrate with a portion of the weakly bound atoms/molecules deflecting off of the interface surface 11s as depicted by arrows L. A portion of the weakly bound atoms/molecules remain in contact with the interface surface 11s. Accordingly, at least a portion of the metal-organic compounds 60m carried by the gas clusters ions 309 remain in contact with the interface surface 11s after the impact. The effect of the impact of the gas clusters ions 309 on the interface surface 11s will depend in part on an acceleration voltage used to accelerate the gas clusters ions 309, a mass of the gas clusters ions 309, the makeup of the constituent atoms and/or molecules that comprise the gas clusters ions 309, and a composition of the target material 11. For example, if the target material 11 comprises an antiferromagnetic material (e.g. IrMn, PtMn, or MnFe), then the effects of the impact of the ionized gas clusters 309 will depend in part on the composition of the antiferromagnetic material. Consequently, the interface surface 11s may only include an uppermost surface of the target material 11 or the interface surface 11s can include the uppermost surface and a very shallow region positioned below the uppermost surface.

Therefore, in FIG. 8a, the interface surface 11s comprises at least an uppermost surface of the target material 11 and the interface surface 11s (see heavy solid arrow for 11s) may also include a shallow portion (see heavy dashed arrow for 11s) of the target material 11 that is positioned a predetermined distance d below the uppermost surface. The predetermined distance d is much less than a thickness t of the target material 11 (i.e. t>>d). As an example, if thickness t is 100 nm, then the predetermined distance d can be about 15 Å (i.e. 1.5 nm). The actual value of the predetermined distance d will be application specific. The predetermined distance d can be measured in monolayers (e.g. $\geq 1.0$ monolayer) or in sub-monolayers (e.g. <1.0 monolayer) and will depend on the material and composition of the target material 11, the materials selected for the metal-organic compounds 60m, the parameters of the GCIB 300 (e.g. acceleration voltage), and the length of bonds between the atoms of the target material 11 and the metal-organic compounds 60m. As another example, the predetermined distance d can be in a range from about 1.0 monolayer to about 5.0 monolayers.

A section I-I of FIG. 8a is enlarged and depicted in greater detail in FIG. 8b. The enlarged section illustrates a position of the metal-organic compounds 60m relative to the interface surface 11s. The metal-organic compounds 60m may be distributed throughout the interface surface 11s in proportions that vary. A portion of the metal-organic compounds 60m can be positioned on the interface surface 11s (i.e. they are positioned on the uppermost surface) and form the manganese diffusion barrier 20 having a thickness T. The thickness T can be measured in monolayers. An actual size of a monolayer will depend on the species (e.g. Co or CoFe) forming the manganese diffusion barrier 20 and a length of the bonds between the atoms or the molecules of the manganese diffusion barrier 20. The thickness T can be in a including but not limited to a range from about 1.0 monolayer to about 10 monolayers. Preferably, the thickness T is uniform across the interface surface 11s.

Another portion of the metal-organic compounds denoted as 60p can be positioned partially in the interface surface 11s (i.e. partially in the predetermined distance d). Yet another portion of metal-organic compounds 60m can be positioned entirely within the interface surface 11s as denoted by metal-organic compounds 60e (i.e. they are disposed entirely within the target material 11). Therefore, a contact of the metal-organic compounds 60m with the interface surface 11s comprises any of the configurations depicted in FIG. 8b. That is, the metal-organic compounds 60m may be positioned on the interface surface 11s, the metal-organic compounds 60p may be positioned partially inward of the interface surface 11s, and the metal-organic compounds 60e may be positioned entirely within the target material 11.

Figure 8C:
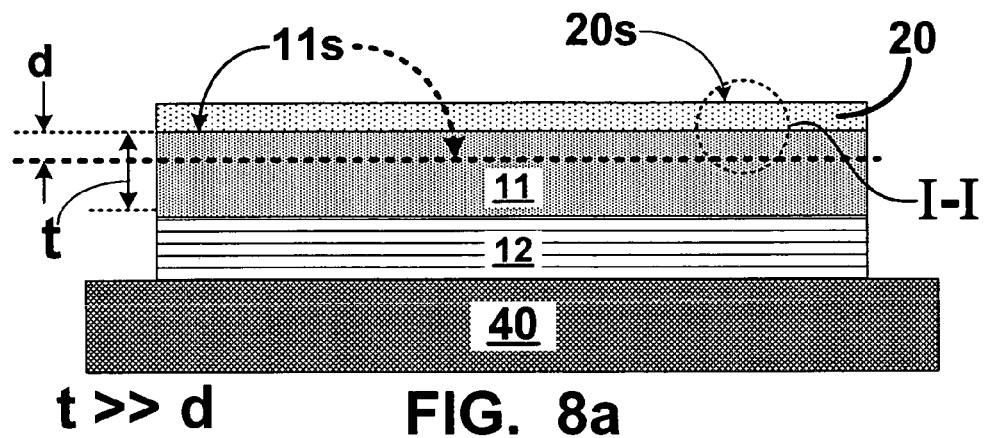
FIG. 8c is a cross-sectional view depicting a deposition order for a depositing of additional layers of material.
Figure 8C:
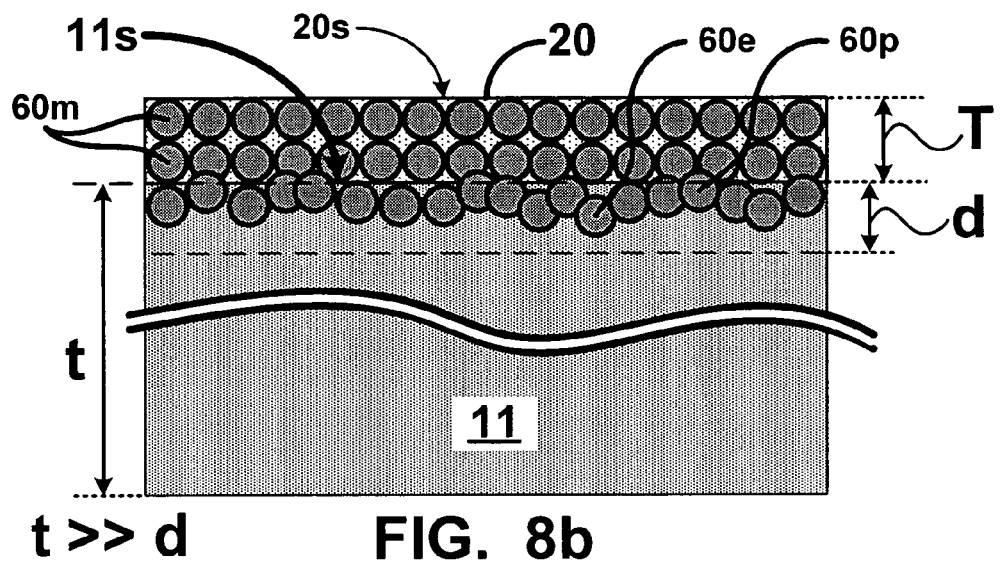
Figure 8C:
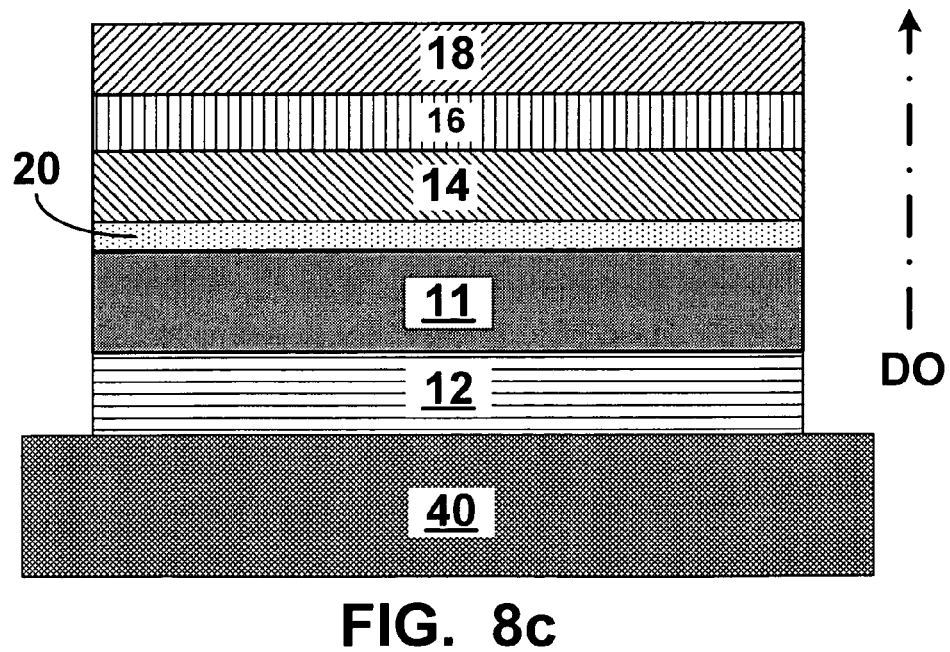

In FIG. 8c, after the deposition of the manganese diffusion barrier 20 on the interface surface 11s of the target material 11, additional layers 14, 16, and 18 can be formed (i.e. deposited, sputtered, etc.) in the deposition order DO to complete the fabrication of the magnetoresistance device 10. As one example, the layers of material (12, 11) can be deposited in the deposition order DO as part of manufacturing process. The layer 12 can be mounted on the substrate 40 through a load lock 620 connected with the processing section 321 of the GCIB 300. The load lock 620 may also be connected with a processing unit (not shown) for performing some other step in the manufacturing process, such as a deposition of a layer of material, for example. After a layer of material is deposited, that layer may subsequently be processed by the GCIB 300 according to the method 100. A plurality of the layers 12 can be carried by a wafer cassette, for example. Individual layers 12 can be removed from the wafer cassette by a robotic arm or the like and then transported between the GCIB 300 and the processing unit via the load lock 620.

Figure 9A:
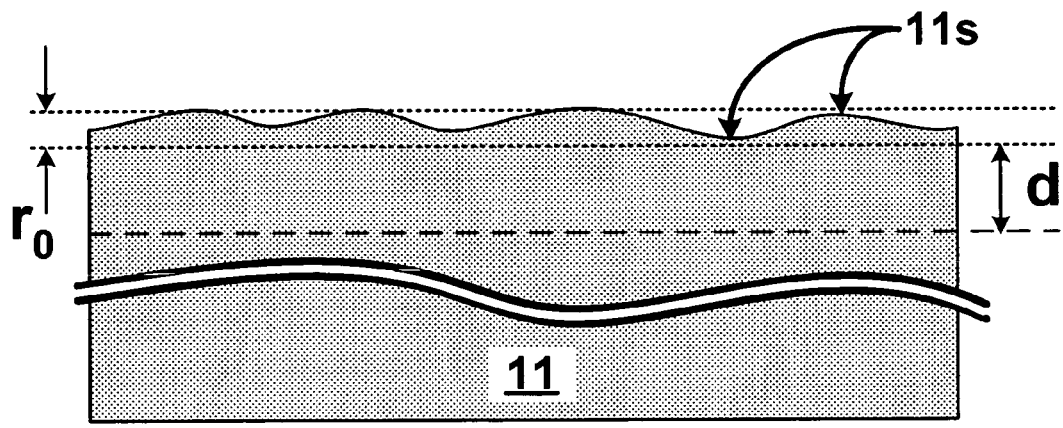
FIG. 9a is a cross-sectional view depicting an interface surface with an initial surface roughness.

Turning to FIG. 9a, the interface surface 11s of the target material 11 need not be a substantially planar surface (i.e. flat) as depicted in FIG. 7a. For example, a topography of the interface surface 11s may include an initial surface roughness $r_0$ as depicted by variations in surface height (i.e. undulations) in the interface surface 11s. The surface roughness $r_0$ can be measured as a RMS surface roughness. Because the interface surface 11s is not flat, a uniform irradiation of the interface surface 11s with the metal-organic compounds 60m may not be possible. Accordingly, the interface surface 11s can be planarized prior to being processed by the GCIB 300 at the stage 112 using a process such as chemical mechanical planarization (CMP), for example. Alternatively, the GCIB 300 can be used to perform a surface smoothing irradiation process on the interface surface 11s to reduce the surface roughness $r_0$ prior to the stage 112. For instance, in FIG. 5, the valve V1 can be closed to cut off the flow of the metal-organic gas 55mo to the manifold 58. The valve V0 is opened to allow only the carrier gas 59 to flow into the stagnation chamber 304 so that the gas cluster ions 309 in the beam 60 are used for smoothing the interface surface 11s. The process of using a GCIB for surface smoothing are well understood in the microelectronics art and good literature exists on GCIB surface smoothing.

An acceleration voltage of the GCIB 300 can be increased to increase a momentum of the gas cluster ions 309 in the beam 60. The increased momentum can be used to hasten the smoothing of the interface surface 11s and/or to effectuate the smoothing when the composition of the target material 11 requires additional force created by the impact of the gas cluster ions 309 with the interface surface 11s. The momentum of the gas cluster ions 309 can also be increased by selecting a carrier gas 59 that has atoms molecules that have a higher mass.

Referring now to FIG. 9b, after the surface smoothing process, a surface roughness $r_1$ of the interface surface 11s is reduced (i.e. $r_1 < r_0$). Subsequently, the irradiation at the stage 112 can proceed using the composite gas 61c to effectuate the bombardment of the interface surface 11s with the metal-organic compounds 60m. Smoothing of the interface surface 11s can occur simultaneously with the irradiating at the stage 112 because the impact of the gas cluster ions 309 on the interface surface 11s can result in the aforementioned surface smoothing. The extent to which the initial surface roughness $r_0$ is reduced to the surface roughness $r_1$ by the irradiating at the stage 112 will depend on several factors including but not limited to a mass and a momentum of the gas cluster ions 309. Process parameters of the GCIB 300 (e.g. acceleration voltage) can be controlled to cause surface smoothing or to prevent surface smoothing during the irradiating at the stage 112.

Figure 10:
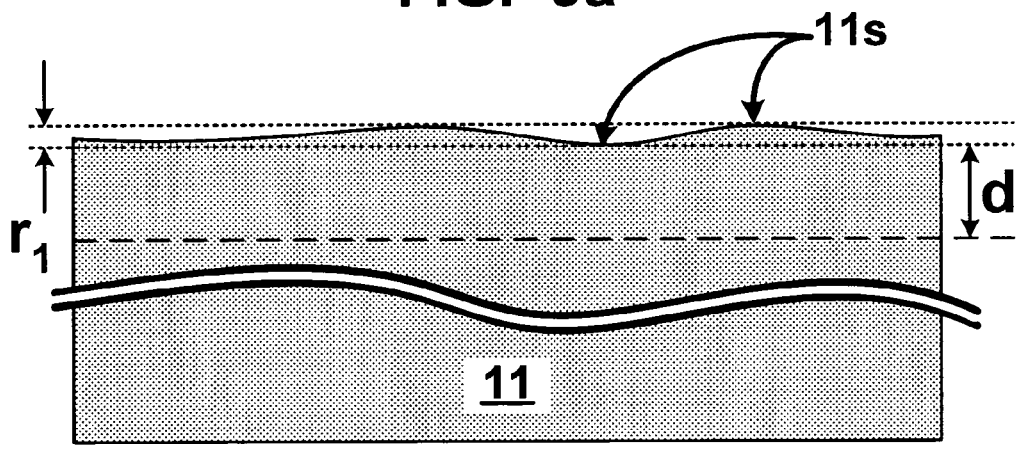
FIG. 10 is a top plan view depicting examples of a relative motion between a beam of gas cluster ions and an interface surface.
Figure 10:
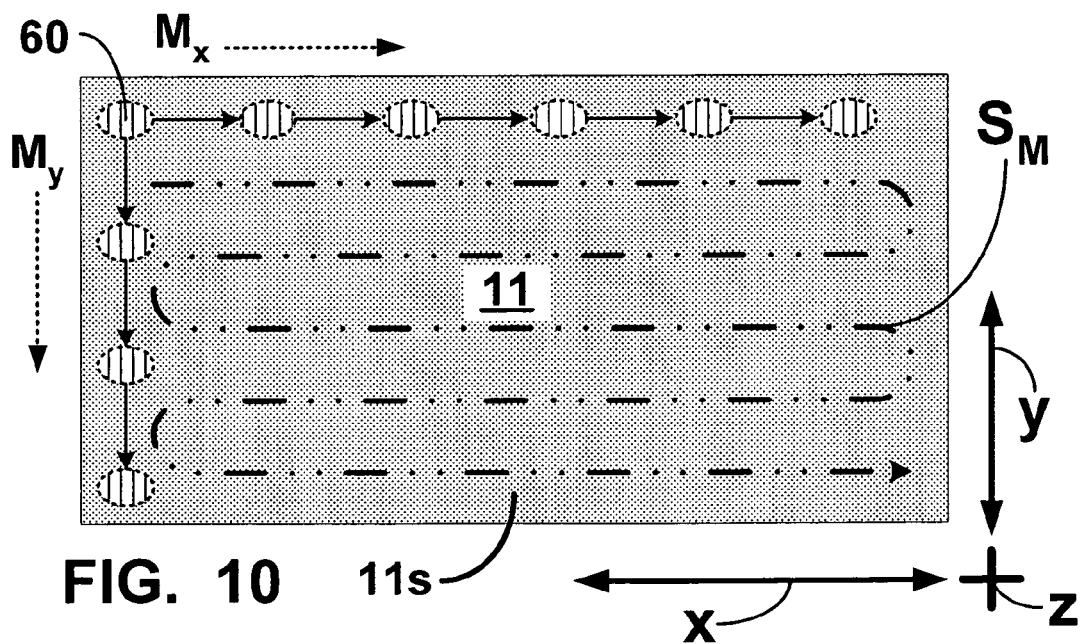

During the irradiating at the stage 112, it may be desirable to target the beam 60 over the entirety of the interface surface 11s or over a only a portion of the interface surface 11s. In FIG. 10, the interface surface 11s of the target material 11 can be moved relative to the beam 60 (i.e. the beam 60 is held stationary) during the irradiating at the stage 112 so that the beam 60 irradiates some or all of the interface surface 11s. The substrate 40 can be connected with a mechanical or an electrical-mechanical means for moving the substrate 40 during the irradiating at the stage 112. As one example, the substrate 40 can be connected with a precision motioned controlled x-y-z stage that is controlled by a computer or a dedicated control unit. The substrate 40 can be moved in a x-direction denoted by a dashed arrow $M_x$ or in a y-direction as denoted by a dashed arrow $M_y$. Consequently, the interface surface 11s is moved relative to the beam 60. As another example, a micrometer stage connected with the substrate 40 can be used to impart motion (see M in FIG. 6) along any selected axes of motion such as along the x-y-z axes depicted in FIGS. 6 and 10 (note: in FIG. 10, the z axis is into the drawing sheet). The motion M can include rotation, linear translation, and tilting of the substrate 40. The motion M can also be used to effectuate the equivalent of a scanning motion by the beam 60 as depicted by a series of dashed lines $S_M$.

As was described above in reference to FIG. 6, the beam 60 can be moved while the substrate 40 is held stationary by electrostatically deflecting the beam 60 using the electrostatic deflection electrodes (325x, 325y). The deflection electrodes 325x can be used to move the beam 60 in the $M_x$ direction along the x-axis X and the deflection electrodes 325y can be used to move the beam 60 in the $M_y$ direction along the y-axis y. The electrostatic deflection electrodes (325x, 325y) can be used in combination to impart a motion that is a vector in the x-y plane. The electrostatic deflection electrodes (325x, 325y) may also be used to scan the beam 60 across the interface surface 11s while the substrate 40 is held stationary. For example, the beam 60 can be scanned $S_M$ as depicted in FIG. 10.

Scanning of the beam 60 can include a raster scanning. Because a range of beam deflection provided by the deflection electrodes (325x, 325y) may be too small to cover the entire interface surface 11s. it may be necessary to move both the beam 60 and the substrate 40 to cover the entire interface surface 11s. Accordingly, one skilled in the art will appreciate that the beam 60 and the interface surface 11s can be moved M relative to each other by applying the above describe motions to both the beam 60 and the substrate 40 at the same time. Furthermore, if the beam 60 has a small beam width, then the beam 60 can be scanned or raster scanned while the substrate 40 is in motion so that a larger area of the interface surface is irradiated during the stage 112.

Figure 11A:
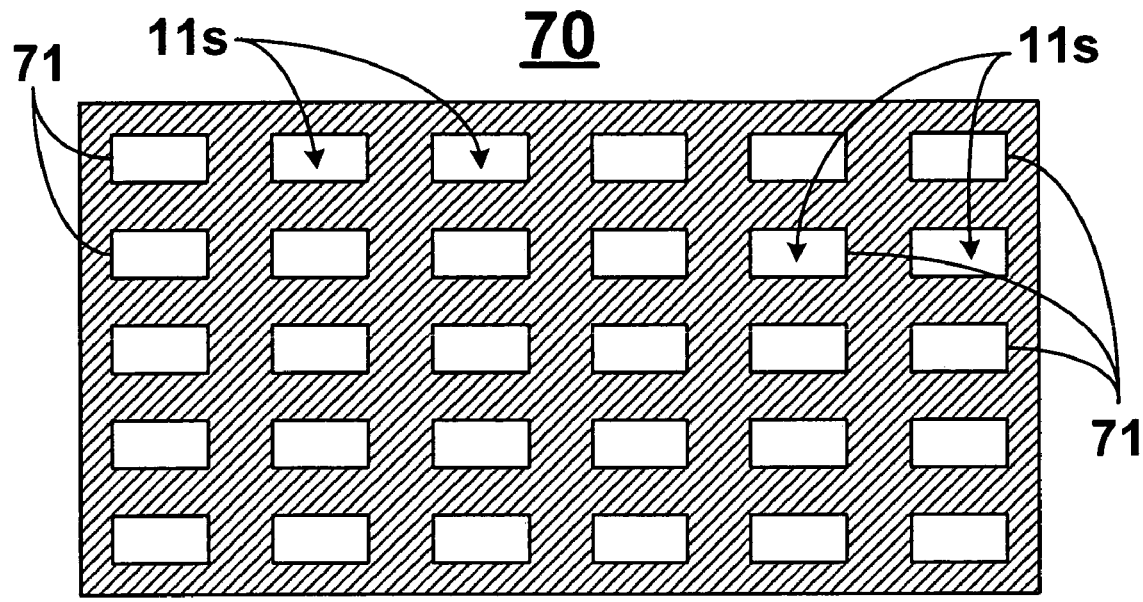
FIGS. 11a through 11c are top plan and cross-sectional views depicting a mask layer positioned relative to an interface surface.
Figure 11B:
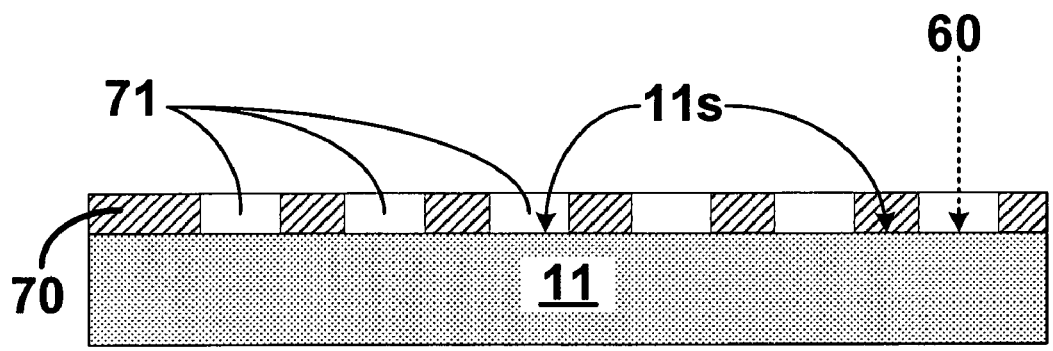
Figure 11C:
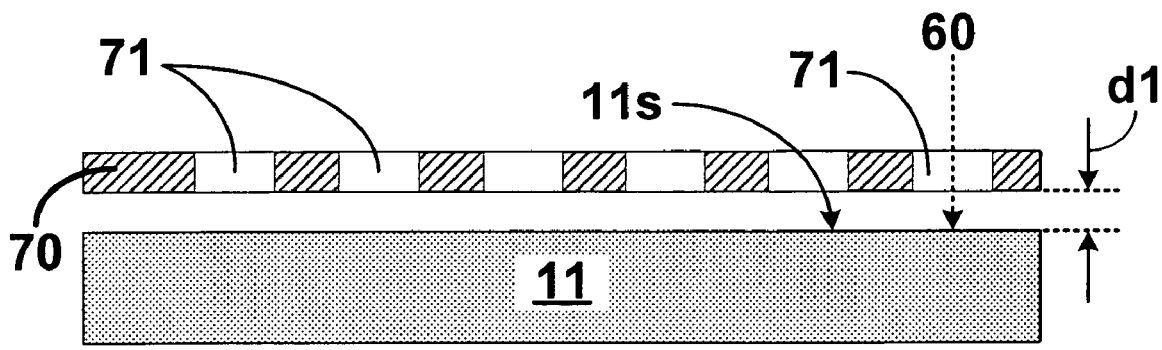

In some applications it may be desirable to control which areas on the interface surface 11s are irradiated by the beam 60. In FIGS. 11a through 11c, a mask layer 70 including one or more apertures 71 can be positioned over the interface 11s. The apertures 71 are through holes that extend all the way through the mask layer 70 so that the beam 60 passes through the apertures 71 and the gas cluster ions 309 impact on those portions of the interface surface 11s that are exposed by the apertures 71. The mask 70 can be used to restrict the impact area of the beam 60 to portions of the interface surface 11s where the manganese diffusion barrier 20 is to be formed. For example, the apertures 71 can define regions where the magnetoresistance devices 10 are formed.

The mask layer 70 may be positioned in contact with the interface surface 11s as depicted in FIG. 11b or the mask layer 70 may be positioned over the interface surface 11s and separated by a distance d1 as depicted in FIG. 11c. Preferably, the distance d1 is as small as possible to prevent the beam 60 from straying outside the bounds defined by the apertures 71. The mask layer 70 can be made from any material that can be patterned including but not limited to a material that can be lithographically patterned and etched using processes that are well understood in the microelectronics art. The mask layer 70 can be applied on the interface surface 11s using well known semiconductor processing techniques and then lithographically patterned and etched to form the apertures 71. For example, the mask layer 70 can be a photoresist material that is spin deposited on the interface surface 11s. The actual shape of the apertures 71 will be application dependent and need not be rectangular as depicted in FIG. 11a.

Figure 12:
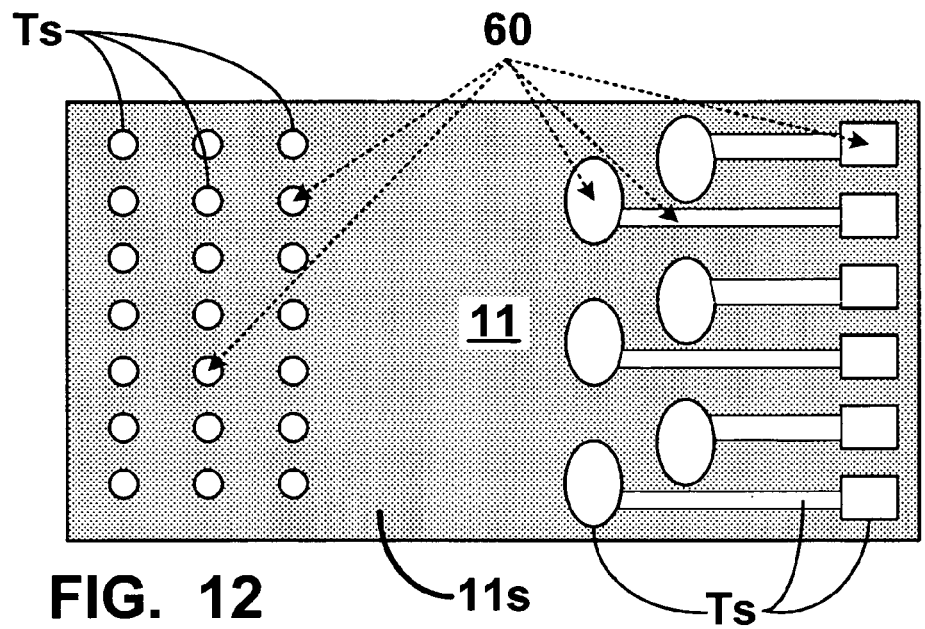
FIG. 12 is a top plan view of a predetermined site on an interface surface that is targeted by a beam of gas cluster ions.

In FIG. 12, the beam 60 is targeted at one or more specific sites Ts on the interface surface 11s to form the manganese diffusion barrier 20. Therefore, the irradiating at the stage 112 is controlled so that the beam 60 irradiates the interface surface 11s only at the specific sites Ts. The aforementioned moving M of the beam 60, the interface surface 11s, or both the beam 60 and the interface surface 11s can be used to target the specific sites Ts. A computer program (e.g. a CAD program) can be used to control the moving M of the substrate 40 in the GCIB 300 and to determine a shape of the specific sites Ts as irradiated (e.g. as painted) on the interface surface 11s. As an example, the specific sites Ts can have a circular shape or a complex shape as depicted in FIG. 12.

Figure 13:
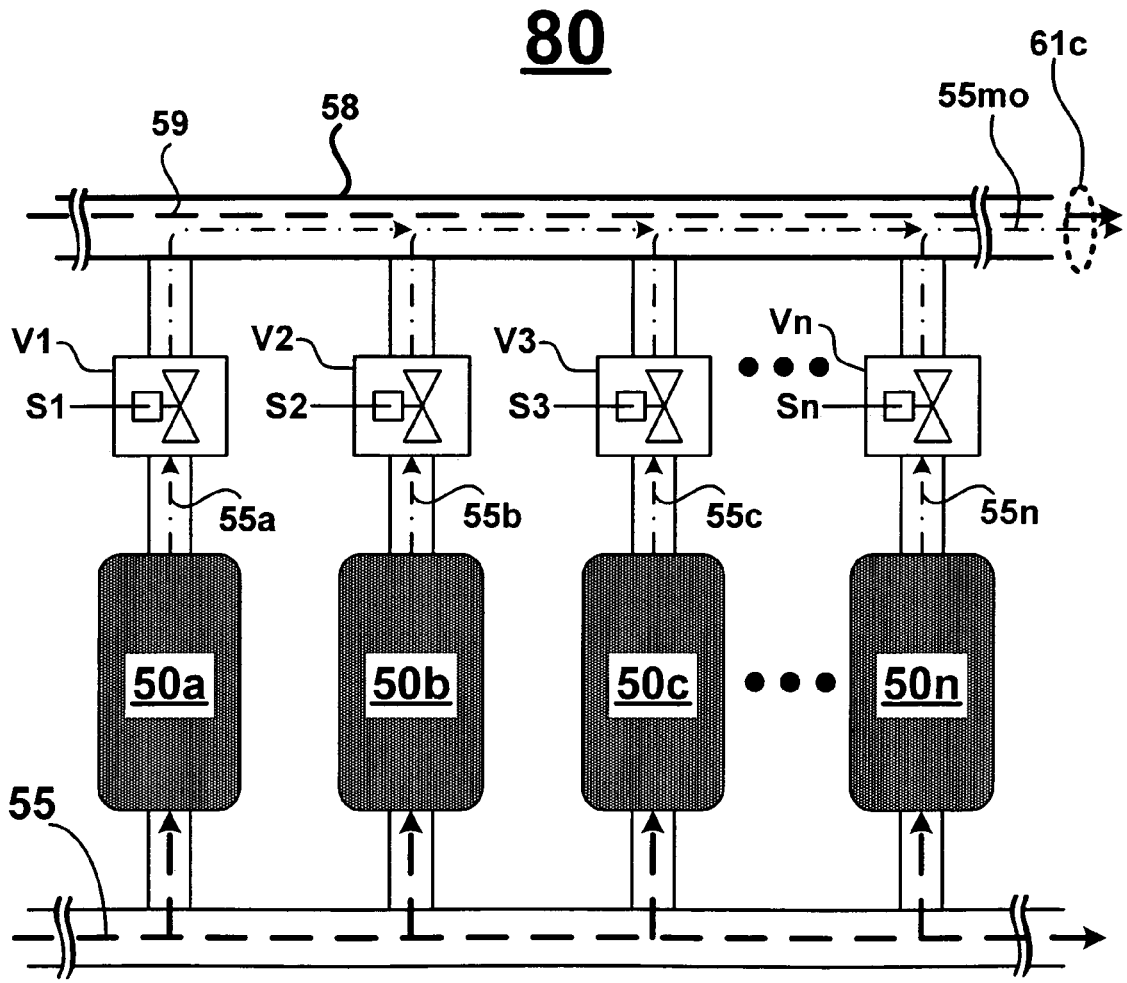
FIG. 13 is a schematic depicting an example of a plurality of metal-organic generators for generating a plurality of different metal-organic compounds.

The composite gas 61c can include one or more metal-organic compounds that are carried by the metal-organic gas 55mo. During a course of the irradiating at the stage 112, it may be desirable to alter the metal-organic compounds 60m that are present in the gas cluster ions 309. In FIG. 13, in a multiple generator system 80, the gas 55 is supplied to metal-organic generators (50a, 50b, 50c, and 50n) each of which contains a different metal-organic source material 51. The generators (50a, 50b, 50c, and 50n) in the multiple generator system 80 may be like the metal-organic generator 50 depicted in FIG. 5.

Valves (V1, V2, V3, and Vn) control a flow of metal-organic gasses (55a, 55b, 55c, 55n) that are generated by the metal-organic generators (50a, 50b, 50c, 50n). The flow of the gasses (55a, 55b, 55c, 55n) is controlled by signals (S1, S2, S3, Sn) which can open, close, or partially open/close their respective valves. A computer or dedicated control unit (not shown) can be used to control the generators and their respective valves. The gas flows (55a, 55b, 55c, and 55n) from the reactors are combined in a manifold 58 where they form the metal-organic gas 55mo that is subsequently mixed with the carrier gas 59 to form the composite gas 61c. As was described above in reference to FIG. 3, the composite gas 61c is supplied to the gas feed tube 302 in the gas source chamber 301 of the GCIB 300.

Figure 14:
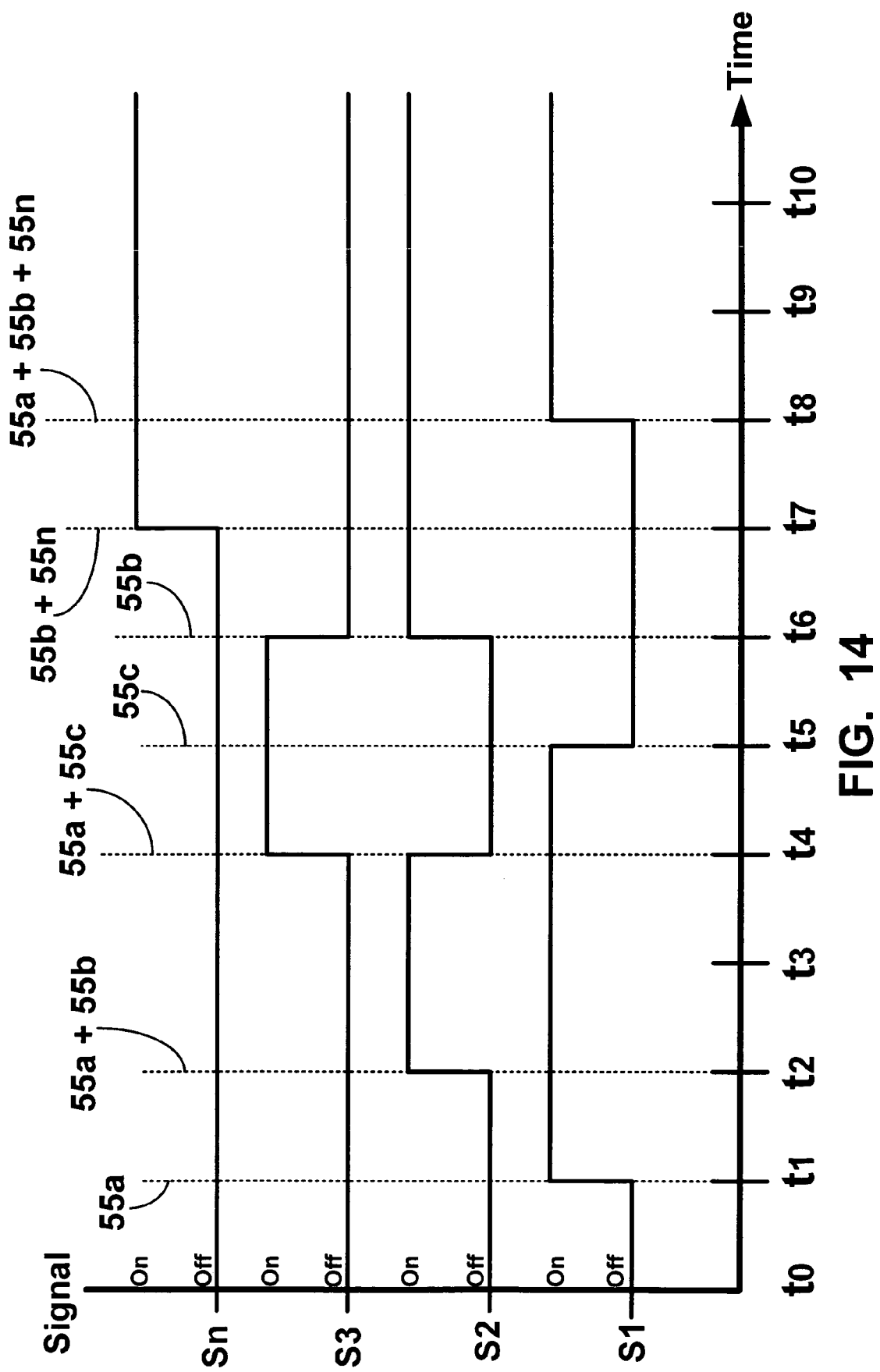
FIG. 14 is a timing diagram depicting a selecting of one or more metal-organic gasses to be combined with a carrier gas in a gas cluster ion beam apparatus.

In FIG. 14, a timing diagram depicts Time on a x-axis and a state (i.e. "On" or "Off") for the signals (S1, S2, S3, Sn) on a y-axis. The signals (S1, S2, S3, Sn) control valves (V1, V2, V3, Vn) as depicted in the multiple generator system 80 of FIG. 13. Therefore, if a signal is "On", then the valve it controls is on and if a signal is "Off", then the valve it controls is off. The composition of the metal-organic gas 55mo is determined by a combination of the metal-organic gasses (55a, 55b, 55c, 55n). From t0 to t2, the metal-organic gas 55mo comprises the metal-organic gas 55a from generator 50a. From t2 to t4, the metal-organic gas 55mo comprises the metal-organic gasses 55a and 55b from generators 50a and 50b. From t4 to t5, the metal-organic gas 55mo comprises the metal-organic gasses 55a and 55c from generators 50a and 50c. From t5 to t6, the metal-organic gas 55mo comprises the metal-organic gas 55c from generator 50c. From t6 to t7, the metal-organic gas 55mo comprises the metal-organic gas 55b from generator 50b. From t7 to t8, the metal-organic gas 55mo comprises the metal-organic gasses 55b and 55n from generators 50b and 50n. Finally, from t8 onward, the metal-organic gas 55mo comprises the metal-organic gasses 55a, 55b, and 55n from generators 50a, 50b, and 50n.

Accordingly, during the course of the irradiating at the stage 112, the beam 60 will contain different metal-organic compounds 60m and different combinations of metal-organic compounds 60m. The units of Time in FIG. 14 will be application specific and could be in units of seconds, minutes, or hours, for example. The signals (S1, S2, S3, Sn) may cause the valves (V1, V2, V3, Vn) to fully open and fully close or the signals may cause the valves to partially open/close so that a flow rate of the metal-organic gasses (55a, 55b, 55c, 55n) from the generators is either increased or decreased by the signals.

The configuration depicted in FIGS. 5 and 13 can also be used to modulate a concentration of the metal-organic compound 60m that is in contact with the interface surface 11s. The valves (V0, V1, V2, V3, Vn) and the signals (S0, S1, S2, S3, Sn) can be used to control gas flow rates and/or a mixing ratio of the metal-organic gas 55mo with the carrier gas 59 to increase or to decrease a concentration of the metal-organic compound 60m in the metal-organic gas 55mo. The heat H applied to the metal-organic source material 51 can also be increased or decreased to increase or decrease the rate at which the metal-organic compound 60m contained in the metal-organic source material 51 dissociate into the gas 55.

User controllable parameters for the GCIB 300 can be used to affect one or more properties of the gas cluster ions 309 in the beam 60. As one example, in FIG. 3, the ionization filaments 313 in the ionization chamber 311 can be used to increase an ionization state of the gas cluster ions 309 during the ionizing at the stage 108. By increasing the ionization state of the gas cluster ions 309, a chemical reactivity of the metal-organic compound 60m with the interface surface 11s can be increased. As a second example, an acceleration voltage applied to the high voltage electrodes of the acceleration section 315 can be increased to increase an acceleration of the gas cluster ions 309 thereby increasing a momentum of the gas cluster ions 309. The increased momentum can be used to control the predetermined depth d at which the metal-organic compounds 60m are positioned in the interface surface 11s.

As a third example, the irradiating at the stage 112 can be continued until a desired concentration of the metal-organic compound 60m is in contact with the interface surface 11s. For instance, the beam 60 can be held stationary at a desired site on the interface surface 11s until the desired concentration of the metal-organic compound 60m is obtained at the site (i.e. a desired concentration of the element Co or CoFe). The beam 60 may also be repeatedly scanned over the interface surface 11s until the desired concentration of the metal-organic compound 60m is obtained. Another parameter that may be controlled to obtain the desired concentration of the metal-organic compound 60m is irradiation time during the irradiating at the stage 112. Referring again to FIG. 8b, the irradiating at the stage 112 can be continued until the thickness T of the manganese diffusion barrier 20 obtains a desired thickness. Continuing the irradiating can also be used to increase both the concentration of the metal-organic compound 60m and the thickness T.

One advantage to the method 100 is that the contact of the metal-organic compound 60m with the interface surface 11s can result in a chemical reaction between metal-organic compound 60m and the target material 11. The chemical reaction can be selected to ensure that an effective manganese diffusion barrier 20 is formed. The effect of the chemical reaction will be substantially located within a region defined by the interface surface 11s (see FIG. 8b) so that the chemical reaction changes a property of the interface surface 11s without changing a property of the entire target material 11. Additionally, the substrate 40 and/or the processing section 321 can be heated or cooled to increase or decrease a temperature of the target material 11. The heating or cooling can be used to control the chemical reaction.

Figure 15:
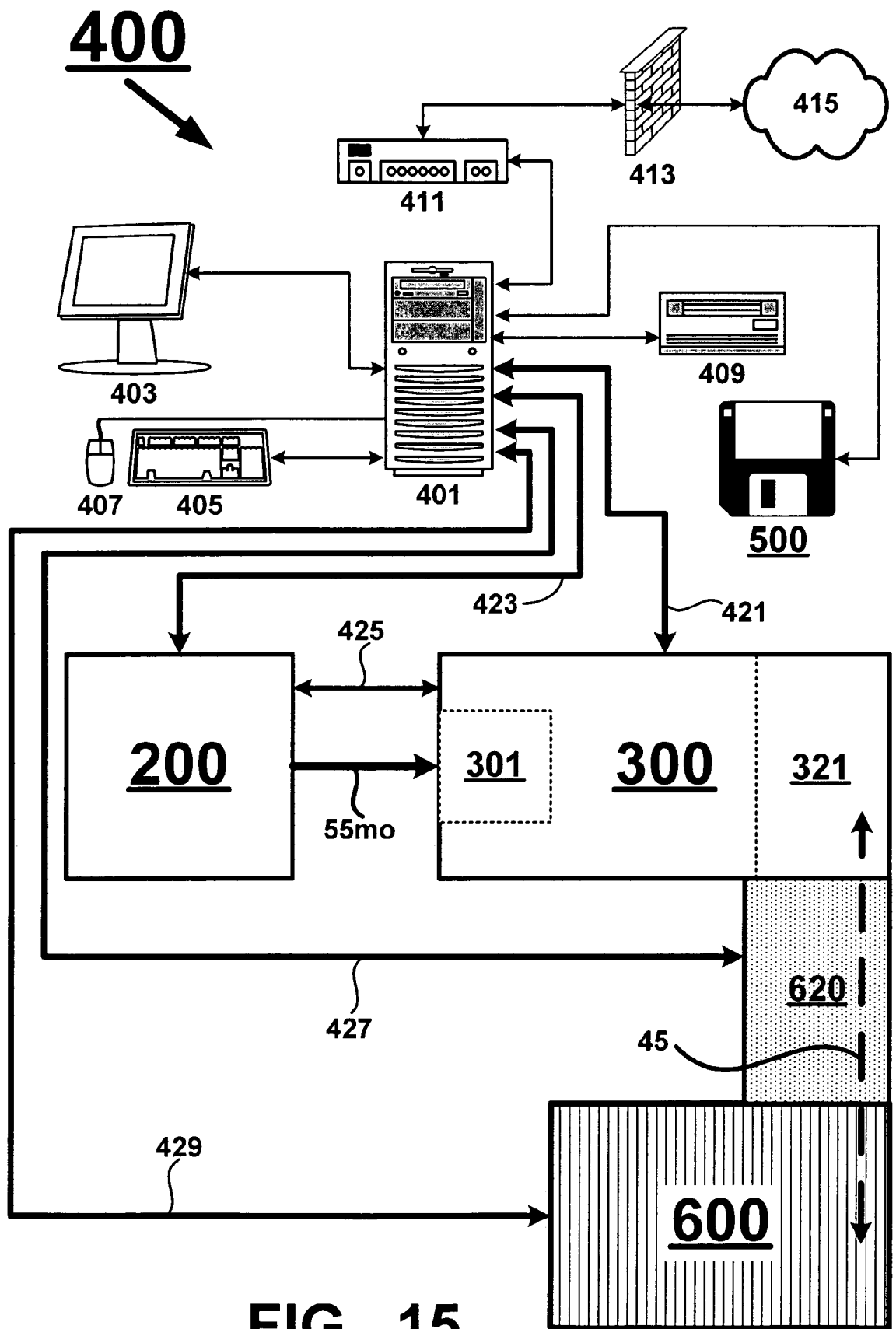
FIG. 15 is a diagram depicting a system for fabricating a manganese diffusion barrier.

In FIG. 15, a system 400 for fabricating a diffusion barrier using a gas cluster ion beam apparatus includes a metal-organic generator 200 that is connected with the gas cluster ion beam apparatus 300. The metal-organic generator 200 generates a metal-organic gas 55mo that includes at least one metal-organic compound 60m. The metal-organic generator 200 can include one or more generators as was described above in reference to FIGS. 5 and 13. The metal-organic gas 55mo is supplied to the gas source chamber 301 of the GCIB 300. As was described above, the metal-organic gas 55mo can be mixed with a carrier gas 59 to form a composite gas 61c that is used to form the beam 60 of gas cluster ions 309.

The system 400 can also include a controller 401 for controlling the GCIB 300 and the metal-organic generator 200. The controller 401 can be a general purpose computer, a work station, a server, a laptop PC, or a dedicated process controller, for example. A commercially available GCIB apparatus 300 may already include a controller 401 that can be used to control the GCIB 300 and the metal-organic generator 200. If necessary, the system 400 may also include input devices such as a keyboard 405, a mouse 407, a display 403, and one or more peripheral devices 409 that are connected with the controller 401. Additionally, the system 400 can include a networking device 411 (e.g. a LAN device) that can be hardwired or wirelessly connected with the controller 401.

The networking device 411 may also allow the controller to communicate with an internal network (e.g. an Intranet) or to communicate with an external network such as the Internet 415. A firewall 413 may also be used to provide secure communications between the controller 401 and the Internet 415. The controller 401 can communicate with and control the GCIB 300 and the metal-organic generator 200 via control signals 421 and 423 respectively. The GCIB 300 and the metal-organic generator 200 may also include a communications link 425 that allows data and control signals to be communicated between them. The keyboard 405, mouse 407, and the display 407 can be used to monitor, stop, start, or modify the processing of an interface surface 11s by the system 400.

Figure 1B:
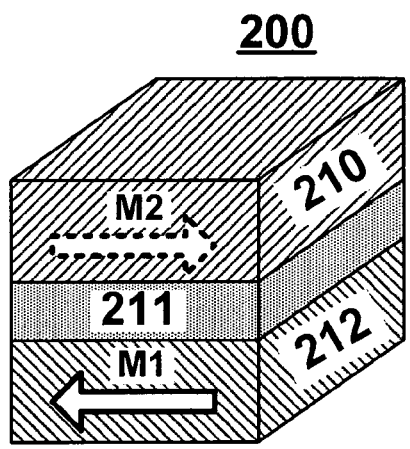
Figure 2A:
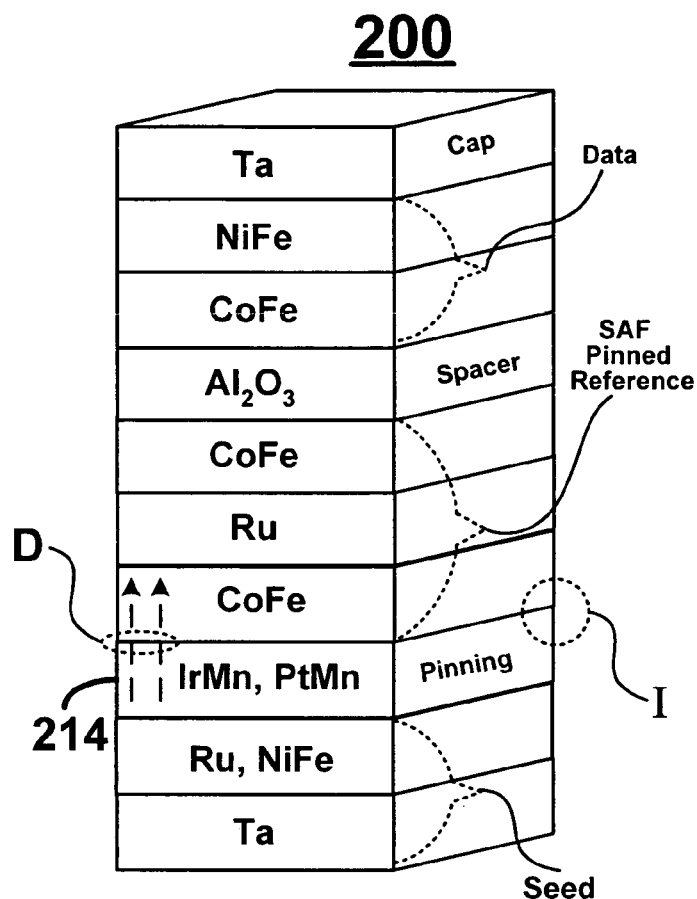
FIGS. 2a and 2b are profile views depicting manganese diffusion from a pinning film into a reference layer in a prior magnetoresistance memory device.
Figure 2B:
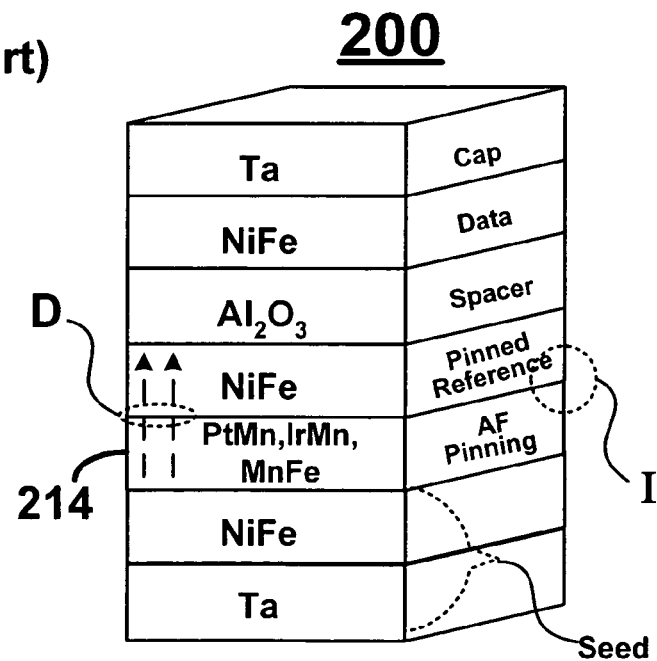

Control of the GCIB 300 and the metal-organic generator 200 by the controller 401 can be by a computer program or an algorithm fixed in a computer readable media 500. The computer readable media 500 can include data and instructions that implement the method 100 of FIG. 1. Although the computer readable media 500 is depicted as a floppy disc, the computer readable media 500 can be any media in which program instructions and data can be fixed and includes but is not limited to optical storage media, magnetic storage media, and solid state memory media. The solid state memory media includes but is not limited to MRAM, SRAM, DRAM, ROM, and flash memory, just to name a few. The computer readable media 500 may be contained within the controller 401 or may be communicated to the controller 401 via a peripheral device 409, the Internet 415, or an local network such as an Intranet. For example, a hard drive in the controller 401 can be the media 500 or an optical disk drive 409 can include an optical disk as the media 500. A suitable programming language including but not limited to C, C++, and JAVA™ can be used to program the instructions that are fixed in the media 500.

The system 400 can also include at least one processing unit 600 that can be connected with the GCIB 300. For instance, the load lock 620 may be used to connect the processing unit 600 with the GCIB 300. Signals (421, 423, 425, 427, 429) from the controller 401 can be used to control and coordinate processing between the GCIB 300, the metal-organic generator 200, the processing unit 600, and the load lock 620. The load lock 620 can be used to transport a work piece (e.g. the target material 11 and its interface surface 11s) back and forth between the GCIB 300 and the processing unit 600.

As one example, the processing unit 600 can be a deposition apparatus for depositing one or more layers of material. The layer of material deposited can be the target material 11 and after the deposition the target material 11 can be moved from the processing unit 600 to the GCIB 300 via the load lock 620 so that the interface surface 11s of the target material 11 can be irradiated to form the manganese diffusion barrier 20. The target material 11 can then be moved back to the processing unit 600 for a deposition of new layer of material on the manganese diffusion barrier 20. After a deposition of the new layer of material in the processing unit 600, the interface surface of the new layer can optionally be moved to the GCIB 300 so that the interface layer of the new layer can be processed.

Although several embodiments of the present invention have been disclosed and illustrated, the invention is not limited to the specific forms or arrangements of parts so described and illustrated. The invention is only limited by the claims.

What is claimed is:

1. A method of fabricating a diffusion baffler using a gas cluster ion beam apparatus, comprising:
   generating a metal-organic gas including a metal-organic compound, the metal-organic compound including a metal material selected from the group consisting of cobalt and cobalt plus iron;
   forming a composite gas by combining the metal-organic gas with a cater gas;
   processing the composite gas in the gas cluster ion beam apparatus to form a beam of gas cluster ions; and
   forming a barrier to manganese diffusion on an interface surface by irradiating the interface surface with the beam, said interface surface is a surface of a layer of material selected from a group consisting of a ferromagnetic layer and an antiferromagnetic layer.

2. The method as set forth in claim 1, wherein the carrier gas comprises a gas selected from the group consisting of an inert gas, nitrogen, oxides of nitrogen, oxygen, carbon dioxide, hydrogen, fluorine, methane, silane, sulfur hexafluoride, carbon monoxide, and a fluorocarbon.

3. The method as set forth in claim 1, wherein a momentum of the gas cluster ions is increased by increasing an acceleration voltage of the gas cluster ion beam apparatus during the accelerating.

4. The method as set forth in claim 1, wherein at least a portion of the metal material is positioned beneath the interface surface by a predetermined depth.

5. The method as set forth in claim 4, wherein the predetermined depth is in a range from about 1.0 monolayer to about 5.0 monolayers.

6. The method as set forth in claim 1 and further comprising: selecting at least two different metal-organic compounds from a plurality of metal-organic generators so that the selected metal-organic compounds are included in the metal-organic gas during the generating.

7. The method as set forth in claim 1 and further comprising: modulating a concentration of the metal material in contact with the interface surface by a selected one of increasing a concentration of the metal-organic compound in the metal-organic gas or decreasing a concentration of the metal-organic compound in the metal-organic gas.

8. The method as set forth in claim 1 and further comprising: continuing the irradiating until a desired concentration of the metal material is in contact with the interface surface.

9. The method as set forth in claim 1 and further comprising: continuing the irradiating until a desired thickness of the barrier to manganese diffusion is formed on the interface surface.

10. The method as set forth in claim 8, wherein the contact of the metal material with the interface surface results in a chemical reaction between the metal material and the interface surface.

11. The method as set forth in claim 1 and further comprising during the irradiating: moving a selected one of the interface surface relative to the beam of gas cluster ions, or moving the beam of gas cluster ions relative to the interface surface, or moving the beam of gas cluster ions and the interface surface relative to each other.

12. The method as set forth in claim 11, wherein moving the beam of gas cluster ions relative to the interface surface comprises scanning of the beam of gas cluster ions over the interface surface.

13. The method as set forth in claim 1, wherein the generating comprises heating the metal-organic compound so that the metal-organic compound dissociates.

14. The method as set forth in claim 1 and further comprising: smoothing the interface surface to reduce a surface roughness of the interface surface, the smoothing occurring prior to said forming of the barrier to manganese diffusion, or during said forming of the barrier to manganese diffusion.

15. The method as set forth in claim 1, wherein the layer is the ferromagnetic layer and is a pinned layer.

16. The method as set forth in claim 1, wherein the layer is the antiferromagnetic layer and is a pinned layer.

17. The method as set forth in claim 1, wherein the layer is the antiferromagnetic layer and includes manganese.

18. The method as set forth in claim 1 and further comprising: targeting the beam of gas cluster ions at one or more specific sites on the interface surface during the irradiating so that the gas cluster ions impact on the specific sites and the metal-organic compound remains in contact with the interface surface at the specific sites to form the barrier to manganese diffusion at the specific sites.

19. The method as set forth in claim 1, wherein the processing comprises: forming a beam comprising a plurality of gas clusters from the composite gas; ionizing the gas clusters to form gas cluster ions; and accelerating the gas cluster ions.

\* \* \* \* \*

UNITED STATES PATENT AND TRADEMARK OFFICE
CERTIFICATE OF CORRECTION

PATENT NO. : 7,504,135 B2  
APPLICATION NO. : 11/050273  
DATED : March 17, 2009  
INVENTOR(S) : Nickel Page 1 of 1

It is certified that error appears in the above-identified patent and that said Letters Patent is hereby corrected as shown below:

In the Claims:
Column 15, Claim 1, Line 27: Please correct "baffer" to read -- barrier --

Column 15, Claim 1, Line 34: Please correct "a cater" to read -- a carrier --

Signed and Sealed this

Nineteenth Day of May, 2009

JOHN DOLL  
*Acting Director of the United States Patent and Trademark Office*